(12) United States Patent
Ashizawa et al.

(10) Patent No.: US 6,242,846 B1
(45) Date of Patent: Jun. 5, 2001

(54) VIBRATION ACTUATOR TO CONTROL PITCHING VIBRATION

(75) Inventors: Takatoshi Ashizawa, Yokohama; Tsuyoshi Matsumoto, Tokyo; Mitsuhiro Okazaki, Soka; Kazuyasu Oone, Urawa, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/248,003

(22) Filed: Feb. 10, 1999

(30) Foreign Application Priority Data

| Feb. 10, 1998 | (JP) | 10-028623 |
| Jun. 3, 1998 | (JP) | 10-154847 |
| Dec. 28, 1998 | (JP) | 10-372319 |

(51) Int. Cl.$^7$ .................................................. H02N 2/00
(52) U.S. Cl. ...................................... 310/323.02; 310/328
(58) Field of Search ........................ 310/323.01, 323.02, 310/326.16, 328

(56) References Cited

U.S. PATENT DOCUMENTS

| 4,613,782 | * | 9/1986 | Mori et al. | 310/323 |
| 5,036,245 | * | 7/1991 | Ohnishi et al. | 310/323 |
| 5,039,899 | * | 8/1991 | Yamaguchi | 310/323.01 |
| 5,101,132 | * | 3/1992 | Yamaguchi | 310/321 |
| 5,105,117 | * | 4/1992 | Yamaguchi | 310/323 |
| 5,136,200 |   | 8/1992 | Takizawa et al. | 310/325 |
| 5,140,215 | * | 8/1992 | Yamaguchi | 310/232.01 |

(List continued on next page.)

FOREIGN PATENT DOCUMENTS

| 63-277477 | 11/1988 | (JP) | H02N/2/00 |
| 7-143770 | 6/1995 | (JP) | H02N/2/00 |
| 8-140374 | 5/1996 | (JP) | H02N/2/00 |

OTHER PUBLICATIONS

*Ultrasonic Motors, Theory and Applications*, "Rectangular Plate Motors", §4.5, pp. 131–135 and "Linear Motors" §5.3.6., pp. 191–196, by S. Ueha, et al., Oxford University Press, New, York, New York, Dec. 1993.*

"Piezoelectric Linear Motors for Moving Optical Pick–up", Y. Tomikawa, et al., 5th Symposium on Dynamics Related to Electromagnetic Force, Collected Papers: Joint Auspices of Japan Mechanical Society, Electrical Society, and Japan AEM Society, Jun. 9–11, 1993, Hitachi City, Japan, pp. 393–398. (English translation attached).*

U.S. application No. 08/377,466, filed Jan. 24, 1995.*

(List continued on next page.)

*Primary Examiner*—Thomas M. Dougherty

(57) ABSTRACT

An ultrasonic actuator to suppress or eliminate pitching vibration arising in a vibration element when driving the ultrasonic actuator and to increase driving efficiency and reduce noise. The ultrasonic actuator includes a vibration element; an electromechanical conversion element mounted on the vibration element to generate a drive force in the vibration element by excitation of the electromechanical conversion element; drive force output members to extract a drive force obtained by excitation of the electromechanical conversion element; a relative motion member in contact with the drive force output members and driven in relative motion with respect to the vibration element by the drive force; a base member; and a fixed member to fix the vibration element to the base member. The vibration element generates, by excitation of the electromechanical conversion element, a first vibration in a first direction, and a second vibration in a second direction different from the first direction, and the fixed member is located in at least two (2) positions along the vibration direction of the first vibration and includes a first restriction member to restrict the vibration element in a vibration direction of the first vibration, and a second restriction member to restrict the vibration element in a vibration direction of the second vibration.

22 Claims, 15 Drawing Sheets

U.S. PATENT DOCUMENTS

| | | | | |
|---|---|---|---|---|
| 5,191,688 | * | 3/1993 | Takizawa et al. | 29/25.35 |
| 5,200,665 | | 4/1993 | Iijima | 310/328 |
| 5,416,375 | * | 5/1995 | Funakubo et al. | 310/317 |
| 5,698,930 | | 12/1997 | Takagi | 310/321 |
| 5,852,336 | * | 12/1998 | Takagi | 310/323 |
| 6,051,912 | * | 4/2000 | Gonda | 310/323.02 |
| 6,091,179 | * | 7/2000 | Tobe et al. | 310/328 |

OTHER PUBLICATIONS

U.S. application No. 08/554,940, filed Nov. 9, 1995.*

U.S. application No. 08/377,466, (abandoned Feb. 1998).

U.S. application No. 08/554,940, Tobe et al., Nikon Corporation, Tokyo, Japan, filed Jun. 13, 1997 (U.S. Patent 6,091,179).

* cited by examiner

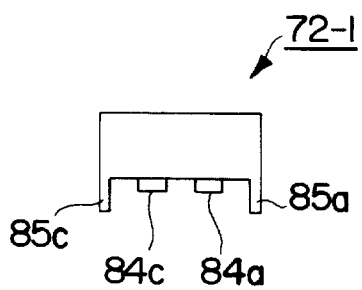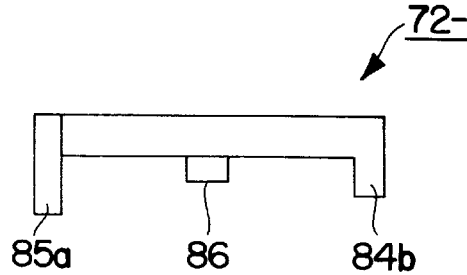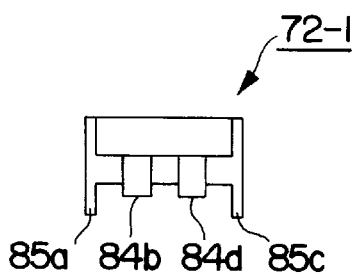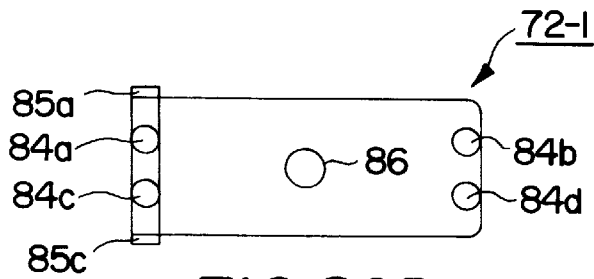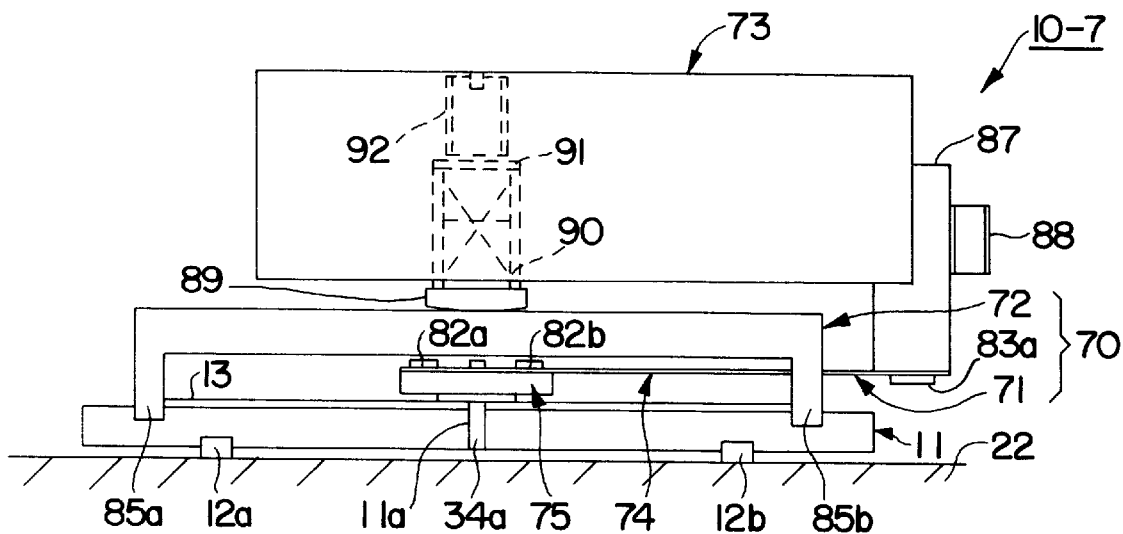

US 6,242,846 B1

VIBRATION ACTUATOR TO CONTROL PITCHING VIBRATION

CROSS-REFERENCE TO RELATED APPLICATIONS

This application is based upon and claims priority of Japanese Patent Applications No. 10-028623 filed Feb. 10, 1998, 10-154847 filed Jun. 3, 1998 and 10-372319 filed Dec. 28, 1998, the contents being incorporated herein by reference.

BACKGROUND OF THE INVENTION

1. Field of the Invention

The present invention relates to a vibration actuator having a vibration element to generate vibration, and to generate relative motion between the vibration element and a relative motion member in compressive contact with the vibration element. More particularly, the present invention relates to an ultrasonic actuator having restriction members to regulate pitching vibration, and a method of producing the vibration actuator.

2. Description of the Related Art

Vibration actuators which generate vibrations in the ultrasonic regions are known as ultrasonic actuators or ultrasonic motors. A conventional vibration actuator using two simultaneously generated degenerate modes of vibration having different form is disclosed, for example, in "Fifth Collected Papers, Fifth Dynamics Symposium Related to Electromagnetic Force", page 393, Tomikawa (hereinafter "Tomikawa").

FIG. 22 is a perspective diagram of a vibration actuator 1 having a vibration element 2 disclosed by Tomikawa. Moreover, FIG. 23 is diagram illustrating a side view of the vibration element 2 and an example of a waveform of two (2) vibrations L1, B4 generated in the vibration element 2. As shown in FIG. 22, the vibration element 2 includes an elastic member 3 and an electromechanical energy converter (referred to hereinbelow as a "piezoelectric member") which converts electrical energy into mechanical energy. The elastic member 3 has a rectangular plate form and is a metallic material having a large resonant sharpness. The piezoelectric member 4 is mounted on one flat side of the elastic member 3. Moreover, two drive force output members 3a, 3b are formed protruding on a flat side of the elastic member 3 opposite the side on which the piezoelectric member 4 is mounted.

As shown in FIG. 22, the piezoelectric member 4 includes four (4) connected regions: input regions 4a, 4b to which two (2) phases A and B of drive voltage $V_A$, $V_B$ are respectively applied; a detection region 4p which monitors the vibration state of the vibration element 2, and a ground region 4g. Silver electrodes 5a, 5b, 5p and 5g, for example, are mutually separately mounted on respective regions 4a, 4b, 4p, 4g.

Sliding members, (not shown in the drawing) formed of a high molecular material as a main component are affixed to the bottom surface of the drive force output members 3a, 3b. A relative motion member 6 is caused to be in compressive contact with the elastic member 3 via the sliding members by a suitable compressive force.

Moreover, the dimensions of the elastic member 3 are set such that the frequencies of the first order longitudinal vibration L1 and the fourth order bending vibration B4 about coincide. Furthermore, the drive force output members 3a, 3b are arranged in the length direction of the vibration element 2 in positions coinciding with the outside antinode positions 11, 14, among four (4) antinode positions 11, 12, 13 and 14 of the bending vibration B4.

As shown in FIG. 23, when high frequency drive voltages $V_A$, $V_B$ with a $\pi/2$ phase displacement are applied to the elastic member 3, a first order longitudinal vibration L1, which vibrates in the length direction of the vibration element 2, and a fourth order bending vibration B4, which vibrates in the thickness direction of the vibration element 2, are simultaneously generated. The longitudinal vibration L1 and the bending vibration B4 generated in the elastic member 3 are combined, and the respective bottom surfaces of the drive force output members 3a, 3b are periodically displaced in elliptical form to generate an elliptical motion. As described above, the vibration element 2 generates relative motion between the drive force output members 3a, 3b and the relative motion member 6.

In the above-described manner, in a vibration actuator including the vibration element 2 having different modes of degenerate form, the longitudinal vibration L1 and bending vibration B4 generated in the elastic member 3 combine to generate elliptical motion in the drive force output members 3a, 3b, and to generate relative motion between the drive force output members 3a, 3b and the relative motion member 6. Accordingly, in the conventional actuator 1, it is necessary for the vibration element 2 and the relative motion member 6 to be placed in compressive contact by a suitable compressive force.

To apply a suitable compressive force, the present Applicant has proposed a compression member which compresses the vibration element 2 toward the relative motion member 6 at one position in the center portion with respect to the length direction of the vibration element 2 (the compression position C shown in FIGS. 22 and 23), as disclosed, for example, in Japanese Laid-Open Patent Publication JP-A-H8-140374.

Using the compression member disclosed in JP-A-H8-140374, the vibration element 2 can be reliably compressed toward the relative motion member 6 with a suitable compressive force, and with a very simple structure. Further, the compression member enables the elliptical motion generated in the vibration element 2 to be efficiently propagated to the relative motion member 6.

Moreover, as shown in FIG. 23, because the compression position C corresponds to the respective nodal positions of the longitudinal vibration L1 and the bending vibration B4 which arise in the elastic member 3, the vibrational attenuation accompanying the compression can be suppressed as much as possible. Because of this, the compression position C shown in FIGS. 22 and 23 was previously considered to be the most preferable position in order to design a vibration actuator which controls the vibrational attenuation accompanying compression, and performs reliable compression. Furthermore, heretofore, it was considered that reliable driving of the vibration actuator 1 was possible by compressing the vibration element 2 toward the relative motion member 6 at the compression position C shown in FIG. 23.

However, upon investigation by the present inventors, it was ascertained that by performing compression at the compression position C accompanying the driving of the vibration element 2, the two end portions in the length direction of the vibration element 2 vibrate, rising and falling in mutually opposite directions, centered on the compression position C. More specifically, the present inventors discovered that a pitching vibration may arise in the vibration element 2. One example of a direction of the pitching vibration is shown by the arrows in FIG. 23.

When the pitching vibration arises in the vibration element 2, noise having the frequency of the pitching vibration is generated, and the silentness, which is a characteristic feature of the vibration actuator, is lost. Moreover, a function (referred to hereinbelow as a "clutch function"), which is continuously propagated to the relative motion member 6 by the longitudinal vibration L1 and bending vibration B4 which arise in the vibration element 2, becomes insufficient, and driving efficiency falls.

Moreover, because the conventional vibration actuator does not include means to control the pitching vibration, the pitching vibration continues to be generated.

SUMMARY OF THE INVENTION

It is an object of the present invention to provide a vibration actuator which solves the above-described problems of the conventional vibration actuator discovered by the present inventors.

It is another object of the present invention to provide a vibration actuator which controls pitching vibration, prevents the generation of noise and the decrease in drive efficiency accompanying pitching vibration, and provides increased performance.

As a result of diligent research by the present inventors, it was determined that while the conventional vibration element 2 is compressed at one compression position C to transmit a compressive force to the relative motion member 6, a compression force is generated in the thickness direction of the relative motion member 6 by the bending vibration B4. A couple, which is a pair of parallel forces having equal magnitude and opposite direction, is then generated about the compression position C, by the reaction of the compression force, and of the couple the vibration element 2 acquires a pitching vibration with the compression position C as its center as a result of the couple.

Consequently, the present inventors conducted further investigations, and the following three points were determined with respect to a vibration actuator including a vibration element which generates a longitudinal vibration and a bending vibration.

(1) The couple acting on the vibration element can be reliably controlled, and the generation of noise and the reduction of clutch function can be prevented, with first restriction member to restrict the vibration element in the vibration direction of the longitudinal vibration, and at at least two (2) places which relate to the direction of the longitudinal vibration, using a second restriction member which restricts the vibration element in the direction of the bending vibration.

(2) The vibration element can be reliably supported without play, and the generation of noise can be controlled, by arranging the first and second restriction members mutually independently in separate members, and by contriving the form of the respective members.

(3) The couple can be more reliably controlled by coupling the second restriction member to the vibration element closer to the vibration element ends than plural drive force output members disposed in the vibration element along the direction of relative motion.

Objects and advantages of the present invention are achieved in accordance with embodiments of the present invention with a vibration actuator comprising a vibration element including an electromechanical conversion element and a drive force output portion to output a drive force obtained by the excitation of the electromechanical conversion element and to cause relative motion between the vibration element and a relative motion member contacting the drive force output portion; a base member; and a fixed member to fix the vibration element to the base member, wherein the vibration element generates, by excitation of the electromechanical conversion element, a first vibration in a first direction, and a second vibration in a second direction different from the first direction, and the fixed member includes a first restriction member to restrict the vibration element in a vibration direction of the first vibration, and a second restriction member located in at least two (2) positions along the vibration direction of the first vibration to restrict the vibration element in a vibration direction of the second vibration.

In accordance with embodiments of the present invention, the first restriction member is coupled to the vibration element in a position corresponding to a node of the first vibration, or a neighborhood of the node of the first vibration, and the second restriction member is coupled to the vibration element in a position corresponding to a node of the second vibration, or a neighborhood of the node of the second vibration.

Moreover, in accordance with embodiments of the invention, the first restriction member can be fixed to the vibration element.

The fixed member may include a compression member and a support member, wherein the compression member compresses the vibration element toward the relative motion member, and the support member displaceably supports the vibration element with respect to a direction of a force which compresses the vibration element toward the relative motion member. The compression member and the support member may be displaceable with respect to the direction of action of the compression force, and do not mutually interfere. The first restriction member may be located in the support member, and also the second restriction member may be located in the compression member.

Moreover, at least one of the compression member and support member may comprise a movement limiting mechanism to limit the movement of the compression member toward the direction of the first vibration.

Moreover, a contact portion of the second restriction member with the vibration element restricts the vibration in a vibration direction of the second vibration, and in a direction intersecting the vibration direction of the first vibration, and the vibration direction of the second vibration.

In accordance with embodiments of the present invention, the first restriction member may move in relative motion with respect to the vibration element in the vibration direction of the second vibration, and the second restriction member may move in relative motion with respect to the vibration element in the vibration direction of the first vibration.

Moreover, in accordance with embodiments of the invention, the fixed member may comprise a compression support member which is displaceably supported in a direction of the force acting to compress the vibration element toward the relative motion member. Further, the first restriction member and the second restriction member may be located in the compression support member.

In accordance with embodiments of the present invention, the fixed member may comprise a first compression force generating member which presses the second restriction member upon the vibration element to cause contact between the vibration element and the relative motion member with a predetermined compressive force.

Moreover, in accordance with embodiments of the present invention, at least a contact portion of the second restriction member with the vibration element may comprise at least one of methacrylate resin, phenolic resin, polyamide resin, fluoro-resin, polyacetal resin, acrylonitrile-butadiene copolymer resin, polyimide resin, polyethylene resin, polyvinyl acetate, polycarbonate resin, polypropylene resin, polystyrene resin, and epoxy resin.

Moreover, the vibration actuator may further comprise a second compression generation member, located on the side opposite the side where the first compression generation member is located, to press the vibration element onto the second restriction member.

Moreover, the vibration actuator may further comprise a third restriction member, located on the side opposite the side where the second restriction member is located, to restrict the vibration element with respect to the vibration direction of the second vibration.

Moreover, in accordance with embodiments of the present invention, the drive force output portion may be located along the first vibration direction of the vibration element, and the second restriction member couples to the vibration element at a position with respect to the first direction closer to an end side of the vibration element than the drive force output portion.

In accordance with embodiments of the present invention, the drive force output portion is located at an antinode position of the second vibration or in a neighborhood of the antinode position, with respect to the first vibration direction.

Moreover, in accordance with embodiments of the invention, the coupling position is at a node position, or in the neighborhood of the node position of the second vibration.

Objects and advantages of the present invention are achieved in accordance with another embodiment of the present invention with a vibration actuator, comprising a vibration element including an electro-mechanical conversion element and a drive force output portion to output drive force obtained by the excitation of the electro-mechanical conversion element, to cause relative motion between the vibration element and a relative motion member contacting the drive force output portion; a base member; and a fixed member to fix the vibration element to the base member, wherein the vibration element generates, by the excitation of the electro-mechanical conversion element, a first vibration in a first direction, and a second vibration in a second direction different from the first direction, and the fixed member includes a first restriction member to restrict the vibration element in a vibration direction of the first vibration, and a second restriction member, arranged in at least two (2) positions along the vibration direction of the first vibration, to restrict the vibration element in a vibration direction of the second vibration, and located on a mutually opposite side with respect to the vibration element.

In accordance with embodiments of the present invention, one side of the second restriction member and comes into contact with the vibration element at a surface on which the drive force output portion is positioned on the vibration element.

BRIEF DESCRIPTION OF THE DRAWINGS

These and other objects and advantages of the invention will become apparent and more readily appreciated from the following description of the preferred embodiments, taken in conjunction with the accompanying drawings of which:

FIGS. 20A–20D are a left side view, a front view, a right side view and a lower surface view of a compression member in accordance with the ninth embodiment of the present invention.

FIG. 21 is a partially transparent front view of the ultrasonic actuator in accordance with a tenth embodiment of the present invention.

DETAILED DESCRIPTION OF THE PREFERRED EMBODIMENTS

Figure 1A:
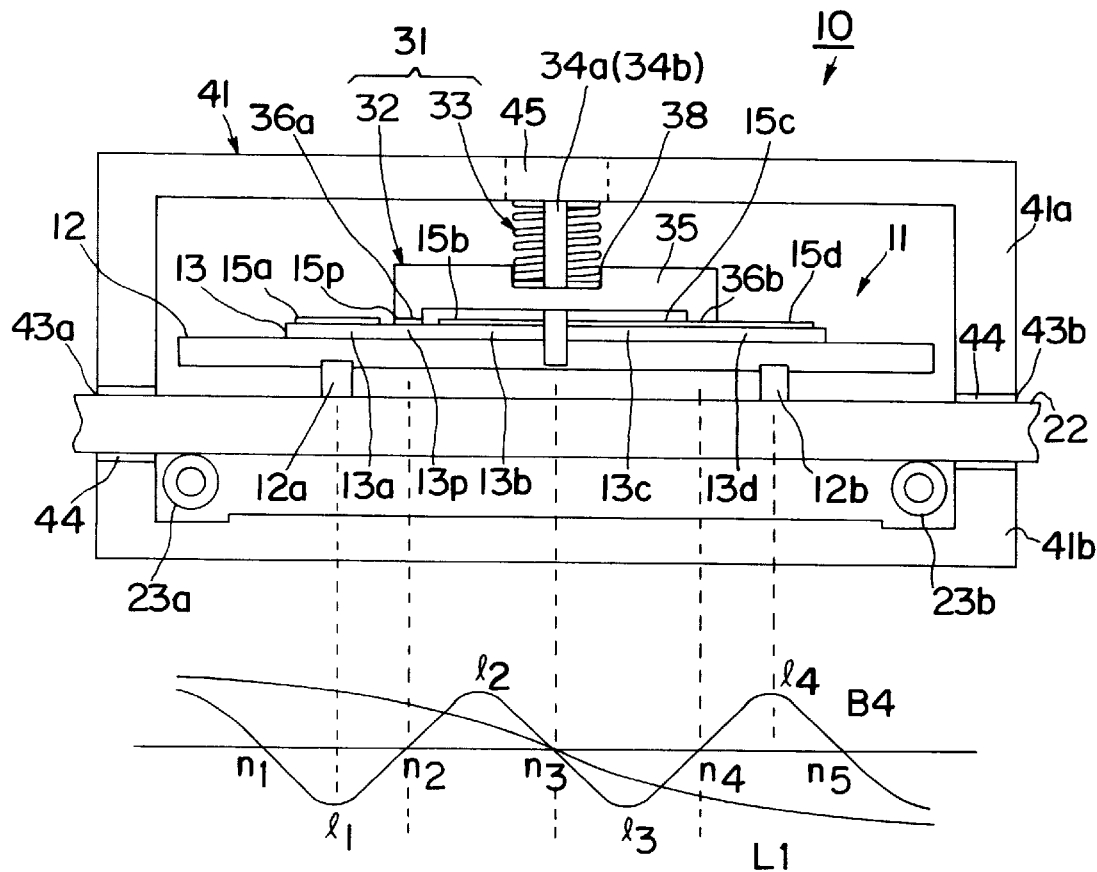
FIG. 1A is a diagram illustrating an ultrasonic actuator and an example of a generated vibration waveform in accordance with a first embodiment of the present invention.

Reference will now be made in detail to the preferred embodiments of the present invention, examples of which are illustrated in the accompanying drawings, wherein like reference numerals refer to like elements throughout.

Embodiments of a vibration actuator in accordance with the present invention are described in detail hereinbelow with reference to the accompanying drawings. Furthermore, the embodiments of the present invention are described hereinafter with reference to an example of an ultrasonic actuator using a vibration actuator in the ultrasonic region of vibration.

First Preferred Embodiment

Figure 1B:
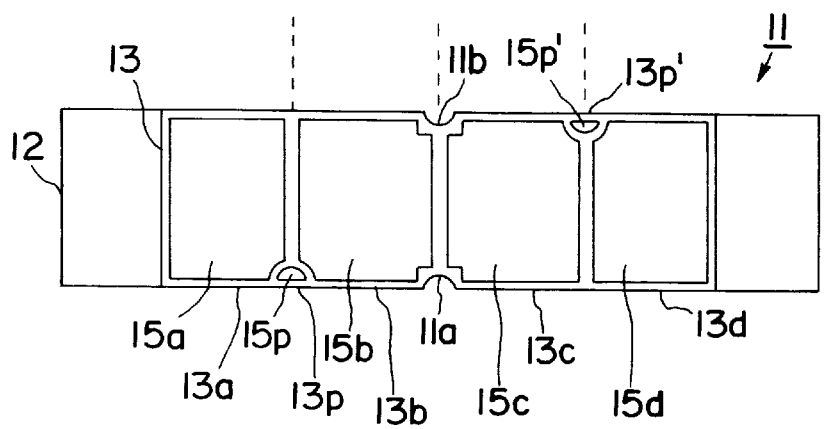
FIG. 1B is a top view showing a vibration element of the ultrasonic actuator in accordance with the first embodiment of the present invention.
Figure 2:
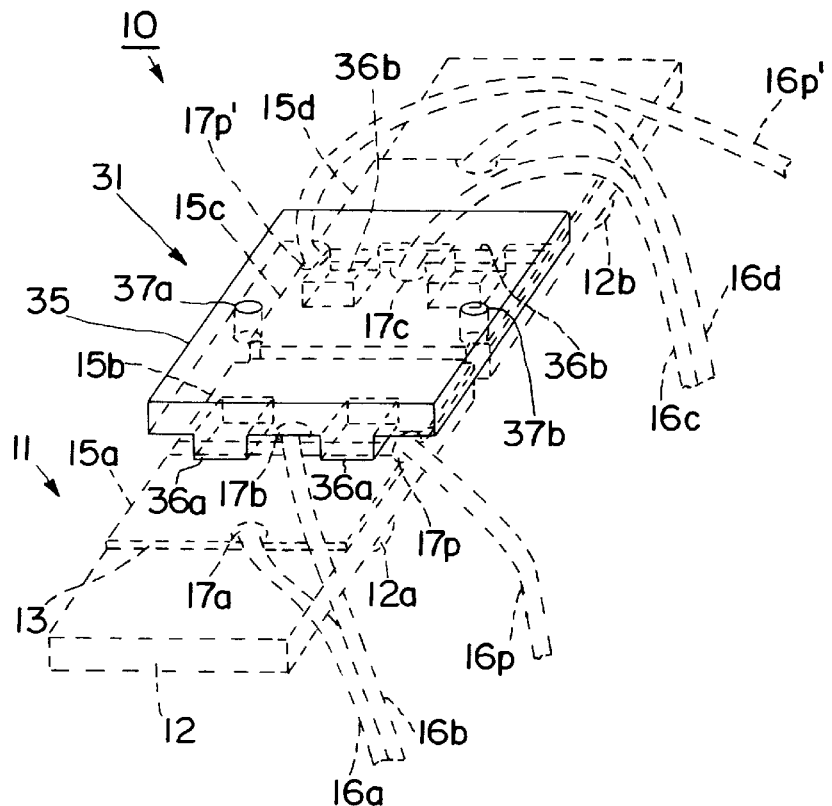
FIG. 2 is a perspective view of the ultrasonic actuator in accordance with the first embodiment of the present invention.

FIGS. 1A and 1B illustrate an ultrasonic actuator 10 in accordance with a first embodiment of the present invention. More particularly, FIG. 1A is a diagram illustrating an ultrasonic actuator 10 and an example of a generated vibration waveform, and FIG. 1B is a top view of a vibration element 11 used in the ultrasonic actuator 10. FIG. 2 is a perspective view of the ultrasonic actuator 10 in accordance with the first embodiment of the present invention.

As shown in FIGS. 1 and 2, the ultrasonic actuator 10 in accordance with the first embodiment of the invention includes a vibration element 11 to generate a first order longitudinal vibration L1, which is a first vibration, and a fourth order bending vibration B4, which is a second vibration; a relative motion member 22; a compression support mechanism 31; and a casing 41, which houses the compression support mechanism 31, and through which the relative motion member 22 passes. These elements are described in more detail hereinbelow.

The vibration element 11 includes an elastic member 12 and a piezoelectric member 13 mounted on a flat surface of one side of the elastic member 12. The elastic member 12 has a rectangular flat plate form and preferably comprises a metallic material having large resonant sharpness, such as steel, stainless steel, phosphor bronze, or Erinvar, etc. Moreover, the dimensions of each portion of the elastic member 12 are set such that the characteristic frequencies of the generated first order longitudinal vibration L1 and fourth order bending vibration B4 about coincide.

The piezoelectric member 13 is adhered, for example, to one flat face of the elastic member 12. Moreover, two (2) grooves separated by a predetermined distance in the relative motion direction (the left and right direction in FIG. 1A) are disposed on the other flat face of the elastic member 12 in the width direction of the elastic member 12. Sliding members which are rectangular in cross section and have an angle bar form are fitted and adhered in the grooves. The sliding members are mounted to project from the elastic member 12 and comprise a high molecular material or the like, such as PTFE, polyimide resin, PEN, PPS, PEEK, and the like. The sliding members function as drive force output members 12a, 12b. The elastic member 12 contacts the relative motion member 22 via the drive force output members 12a, 12b comprising the sliding members.

Furthermore, each drive force output member 12a, 12b is divided into two (2) elements in the width direction of the vibration element 11, and the two elements are respectively located at the ends of the width direction of the vibration element 11. In accordance with the first embodiment of the present invention, the respective drive force output members 12a, 12b comprise two (2) sliding members. Accordingly, the vibration element 11 comprises four (4) sliding members.

As shown in FIG. 1A, the drive force output members 12a, 12b are disposed in positions coinciding with the outer position antinode positions l1, l4 among the four (4) antinode positions l1–l4 of the fourth order bending vibration B4. Furthermore, it is not necessary to dispose the drive force output members 12a, 12b in positions accurately coinciding with the antinode positions l1, l4 of the bending vibration B4. Alternatively, the drive force output members 12a, 12b may be disposed in the neighborhood of the antinode positions l1, l4.

In accordance with the first embodiment of the present invention, the piezoelectric member 13 comprises one (1) thin plate piezoelectric member preferably made of PZT (lead zirconium titanate). The piezoelectric member 13 includes input regions 13a, 13c to which A phase drive signals are input, and input regions 13b, 13d, to which B phase drive signals are input (about $\pi/2$ displaced in phase from the A phase). As shown in FIG. 1B, the input regions 13a–13d are respectively formed connected to four (4) regions compartmented by five (5) nodal positions n1–n5 of the bending vibration B4. More particularly, each input region 13a–13d deforms as a result of the input of drive signals, but none extends over a respective nodal position n1–n5. Because of this arrangement, the deformation of the input regions 13a–13d is not suppressed by the nodal positions n1–n5. Accordingly, the electrical energy input into each input region 13a–13d is converted to deformation of the elastic member 12, specifically, converted into mechanical energy, with maximum effect.

Moreover, detection regions 13p, 13p' are disposed at the nodes n2, n4 of the bending vibration B4. The detection regions 13p, 13p' output electrical energy as a result of the longitudinal vibration L1 generated by the vibration element 11. The vibrational state of the longitudinal vibration L1 generated by the vibration element 11 is monitored by the detection regions 13p, 13p'.

Each input region 13a–13d and each detection region 13p, 13p' has a surface covered with a respective silver electrode 15a–15d, 15p, 15p'. Accordingly, each input region 13a–13d independently inputs drive signals, and each detection region 13p, 13p' can output independent detection signals.

As shown in FIG. 2, each silver electrode 15a–15d, 15p, 15p' is respectively connected to a lead wire 16a–16d, 16p, 16p' in order to perform transfer of electrical energy by respective soldered portions 17a–17d, 17p, 17p' which bulge out.

Furthermore, in accordance with the first embodiment of the invention, as shown in FIG. 1B, the vibration element 11 is formed such that it exhibits point symmetry centered on a center portion of its flat surface. Accordingly, the elliptical motion generated in the drive force output members 12a, 12b has about the same form, and drive error which accompanies a reversal of the direction of relative motion is about eliminated.

Figure 3:
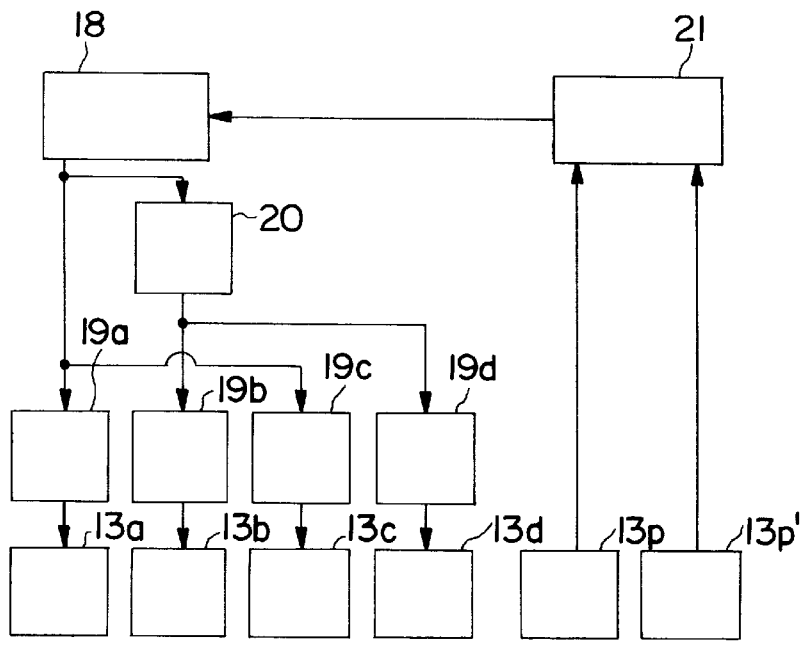
FIG. 3 is a block diagram of drive circuit of the vibration element of the ultrasonic actuator in accordance with the first embodiment of the present invention.

FIG. 3 is a block diagram of a drive circuit of the vibration element 11 in accordance with the first embodiment of the present invention. As shown in FIG. 3, an oscillator 18 generates signals having a frequency corresponding to the longitudinal vibration L1 and bending vibration B4 of the vibration element 11. The output of the oscillator 18 is branched into two outputs. One output is amplified by amplifiers 19a, 19c, and the respective outputs of amplifiers 19a, 19c are input to the silver electrodes 15a, 15c of the input regions 13a, 13c. The other branched output, after having its phase displaced by $\pi/2$ from the A phase voltage by a phase shifter 20, is input as a B phase drive signal to the silver electrodes 15b, 15d of the input regions 13b, 13d via the amplifiers 19b, 19d.

Output voltages from the detection regions 13p, 13p' are input to a control circuit 21. The control circuit 21 compares the output voltages with a standard voltage which is previously set, and controls the amplifier 18 to lower the frequency when the output from the detection regions 13p, 13p' is smaller than the standard voltage. On the other hand, the control circuit 21 controls the amplifier 18 to raise the frequency when the output from the detection regions 13p, 13p' is larger than the standard voltage. The vibration amplitude of the vibration element 11 is maintained at a predetermined magnitude by the control circuit 21.

In the above-described manner, an A phase drive signal having a frequency at which the characteristic frequencies of the longitudinal vibration L1 and the bending vibration B4 agree is input to the input regions 13a, 13c of the piezoelectric member 13. Moreover, a B phase drive signal having a phase difference of $\pi/2$ from the A phase drive signal is input to the input regions 13b, 13d. As a result of the drive signals, as shown in FIG. 1A, a first order longitudinal vibration L1, which is a first vibration in the relative motion direction (the left and right direction in FIG. 1), and a fourth order bending vibration B4 which is a second vibration in a direction intersecting the direction of relative motion, are simultaneously generated in the elastic member 12. The combination of the first order longitudinal vibration L1 and the fourth order bending vibration B4 generates elliptical motion in the drive force output members 12a, 12b.

FIGS. 4A–4D are diagrams periodically showing the state of generation of elliptical motion in the drive force output members 12a, 12b by combining a first order longitudinal vibration L1 and a fourth order bending vibration B4. Furthermore, in FIGS. 4A–4D, for convenience, each output region 13a–13d is shown in a mutually separated state.

Figure 4D:
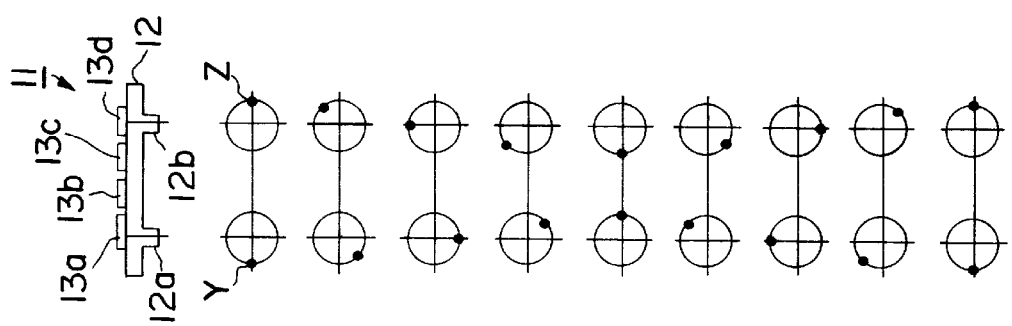
FIG. 4A–4D are diagrams illustrating generation of elliptical motion in a drive force output member by combining a first order longitudinal vibration and a fourth order bending vibration in the vibration element in the ultrasonic actuator in accordance with the first embodiment of the present invention.
Figure 4C:
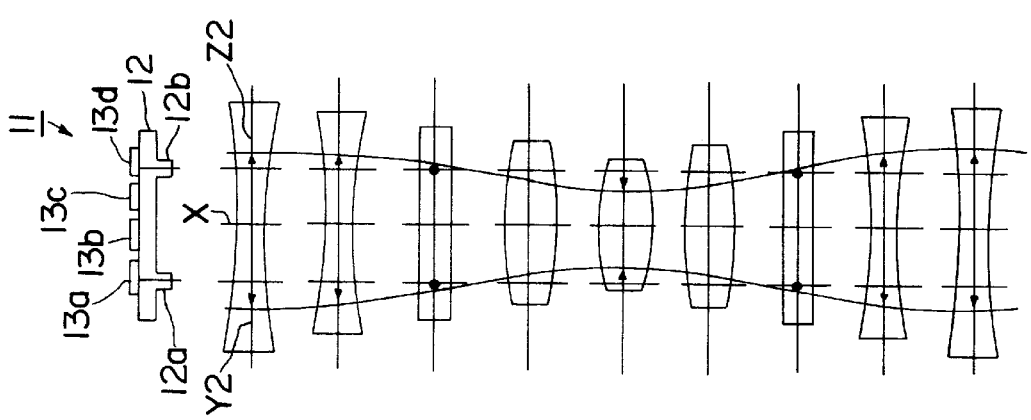
Figure 4B:
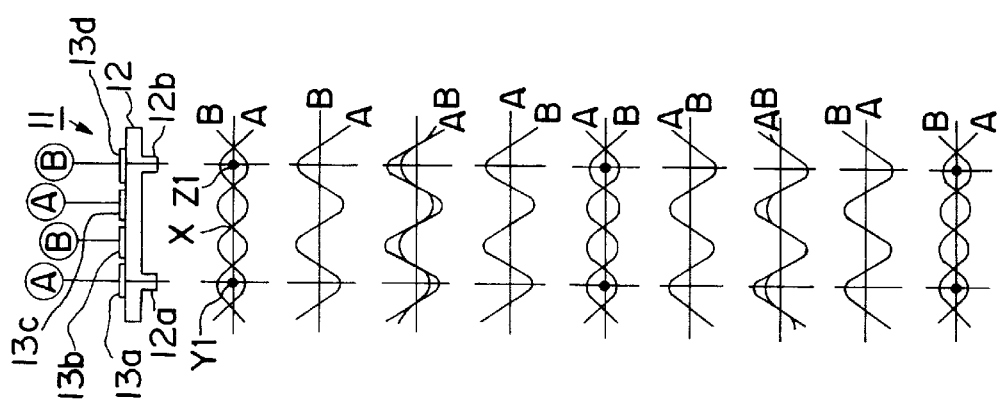
Figure 4A:
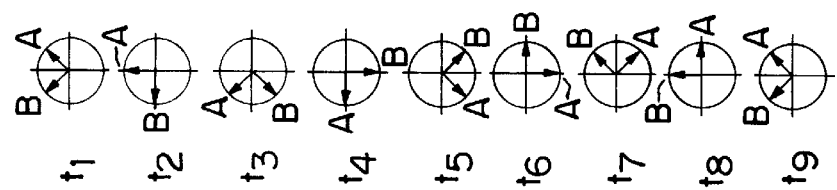

In particular, FIG. 4A illustrates the time changes of the two (2) phase drive signals (drive voltages) A, B for times t1–t9. The ordinate in FIG. 4A shows the effective value of the high frequency voltage. FIG. 4B illustrates the deformation of a cross section of the elastic member 12, and shows the time changes of the bending vibration B4 (second vibration) generated in the vibration element 11 for the times t1–t9. FIG. 4C illustrates the changes of the cross section of the elastic member 12, and shows the time changes of the longitudinal vibration L1 (first vibration) generated in the vibration element 11 for the times t1–t9. Furthermore, FIG. 4D illustrates the time changes of the elliptical motion generated in the drive force output members 12a, 12b of the vibration element 11 for the times t1–t9.

As shown in FIG. 4A, at time t1, the A phase drive signal generates a positive voltage, and the B phase drive signal generates the same positive voltage. As shown in FIG. 4B, the bending vibrations due to the A phase and the B phase drive signal mutually cancel, and the material points Y1 and Z1 both become zero in amplitude. Moreover, as shown in FIG. 4C, a longitudinal vibration is generated in the elastic member 12 in a stretching direction by the A phase drive signals and B phase drive signals. As shown by the arrows in FIG. 4C, at time t1, material points Y2, Z2 together show a maximum extension centered on the nodal position X (the nodal position n3 in FIG. 1A). As a result, as shown in FIG. 4D, the longitudinal vibration and the bending vibration are combined, and the combination of the motion of the material points Y1, Y2 comprises the motion of the material point Y. Moreover, the combination of the motion of the material points Z1, Z2 comprises the motion of the material point Z.

As shown in FIG. 4A, at time t2, the A phase drive signal generates a positive voltage, and the B phase drive signal becomes zero. As shown in FIG. 4B, a bending vibration is generated by the A phase drive signal, the material point Y1 displaces in the negative direction, and the material point Z1 displaces in the positive direction. Moreover, as shown in FIG. 4C, a longitudinal vibration is generated by the A phase drive signal, and the material points Y2 and Z2 contract from their positions at time t1. As a result, as shown in FIG. 4D, the longitudinal vibration and the bending vibration are combined, and the material points Y and Z together rotate counterclockwise from their positions at time t1.

As shown in FIG. 4A, at time t3, the A phase drive signal generates a positive voltage, and the B phase drive signal generates an equal but negative voltage. As shown in FIG. 4B, at time t3, a bending vibration is generated by the A phase drive signal and the B phase drive signal, combined and amplified, and the material point Y1 displaces more in the negative direction than at time t2. Moreover, the material point Z1 is amplified more in the positive direction than at time t2, and exhibits a maximum positive amplitude value. Moreover, as shown in FIG. 4C, the longitudinal vibrations generated by the A phase drive signal and the B phase drive signal mutually cancel, and the material points Y2 and Z2 return to their initial positions. As a result, as shown in FIG. 4D, the longitudinal vibration and the bending vibration are combined, and the material points Y and Z together rotate further counterclockwise from their positions at time t2.

As shown in FIG. 4A, at time t4, the A phase drive signal becomes zero, and the B phase drive signal generates a positive voltage. As shown in FIG. 4B, a bending vibration is generated by the B phase drive signal, the material point Y1 decreases in amplitude from the time t3, and the material point Z1 decreases in amplitude from the time t3. Moreover, as shown in FIG. 4C, a longitudinal vibration is generated by the B phase drive signal, and the material points Y2 and Z2 contract together. As a result, as shown in FIG. 4D, the longitudinal vibration and the bending vibration are combined, and the material points Y and Z together rotate still further counterclockwise from their positions at time t3.

As shown in FIG. 4A, at time t5, the A phase drive signal generates a negative voltage, and the B phase drive signal generates the same negative voltage. As shown in FIG. 4B, the bending vibrations as a result of the A phase drive signal and the B phase drive signal mutually cancel, and the material points Y1 and Z1 both become zero amplitude. Moreover, as shown in FIG. 4C, a longitudinal vibration is generated in the stretching direction by the A phase drive signal and B phase drive signal. At time t5, the material points Y2, Z2 together, as shown by the arrows, show a maximum contraction centered on the nodal position X (the nodal position n3 in FIG. 1A). As a result, as shown in FIG. 4D, the longitudinal vibration and the bending vibration are combined, and the material points Y and Z together rotate counterclockwise from their positions at time t4.

For times t6–t9 also, longitudinal vibrations and bending vibrations are generated similarly to times t1–t5, and, as a result, as shown in FIG. 4D, the material points Y and Z rotate counterclockwise. In the above-described manner, an elliptical motion, displaced counterclockwise by a half cycle, is respectively generated in the vibration element 11 and the drive force output members 12a, 12b. The relative motion member 22, which is in compressive contact with the drive force output members 12a, 12b, is driven in one direction by the generated elliptical motion.

Moreover, to make the relative motion member 22 reverse in its direction, the B phase drive signal may be set to a phase difference of $-\pi/2$ with respect to the A phase drive signal.

As shown in FIG. 1A, the relative motion member 22, which is a moving member, is located in contact with the drive force output members 12a, 12b of the vibration element 11. In accordance with the first embodiment of the present invention, the relative motion member 22 is formed of a zonal lamina, and is preferably made of stainless steel. The relative motion member 22 is driven in the same direction (left to right direction in FIG. 1A) as the vibration direction of the longitudinal vibration L1 by the elliptical motion generated in the drive force output members 12a, 12b. Furthermore, the relative motion member 22 may preferably comprise a copper alloy, aluminum alloy, or furthermore a macromolecular material, or the like.

The relative motion member 22 is conveyed, guided by conveyor rollers 23a, 23b in contact with one surface of the relative motion member 22, and four (4) conveyor rollers (not shown in the drawing) in contact with both end faces of the width direction of the relative motion member 22. The conveyor rollers guide the relative motion member 22 such that it is capable of reciprocating motion in both of the relative motion directions.

Moreover, the six (6) conveyor rollers, including the conveyor rollers 23a, 23b, are supported to rotate freely by a casing 41, as will be described in detail hereinbelow.

As shown in FIG. 1A and in FIG. 2, the compression support mechanism 31 includes a compression support member 32, which performs restriction of the vibration element 11, and a first compression force generating member 33, which urges the vibration element 11 toward the relative motion member 22. Furthermore, for convenience of illustration, the compression support mechanism 31 shown in FIG. 2 is partially omitted.

The compression support member 32 and the first compression force generating member 33 will now be described in more detail hereinbelow. The compression support member 32 in accordance with the first embodiment of the invention comprises two (2) restricting pins 34a, 34b, which operate as a first restriction member, and a laminar compression support member 35 having two projecting units 36a, 36b, which operate as a second restriction member. The restricting pins 34a, 34b respectively have one end fixed to a ceiling surface of the casing 41, described in more detail hereinafter. The restricting pins 34a, 34b pass through through holes 37a, 37b disposed in the compression support member 35 in a state having a gap with respect to the compression support member 35. Semicircular notches 11a, 11b are disposed in the center of the length direction of the vibration element 11 (node n3 of the first order longitudinal vibration L1, which is the first vibration generated in the vibration element 11), into which the restricting pins 34a, 34b fit. The restricting pins 34a, 34b fit into the semicircular notches with a loose fit, that is, with a fit having a clearance. The vibration element 11 is reliably restricted in the movement direction of the longitudinal vibration L1 by the restricting pins 34a, 34b. Furthermore, it is not necessary that the position at which the restricting pins 34a, 34b fit into the vibration element 11 accurately coincide with the nodal position n3 of the longitudinal vibration L1, which is the first vibration. Alternatively, the position at which the restricting pins 34a, 34b fit into the vibration element 11 may be in the neighborhood of the nodal position n3.

Moreover, as shown in FIG. 1A and in FIG. 2, the compression support member 35 is located with respect to the vibration element 11 on the side opposite to the side where the relative motion member 22 is located. Because the through holes 37a, 37b through which the restricting pins 34a, 34b pass are formed in the compression support member 35 such that there is a clearance between the through holes 37a, 37b and the restricting pins 34a, 34b, the compression support member 35 is displaceably supported with respect to the direction through which the restricting pins 34a, 34b pass. Specifically, compression support member 35 is displaceably supported in the direction in which the compressive force compresses the vibration element 11 in the direction of the relative motion member 22.

Moreover, projecting units 36a, 36b having rectangular form are disposed on both sides of the compression support member 35 in the relative motion direction toward the flat surface of the vibration element 11. The projecting units 36a, 36b are located such that they contact the vibration element 11 in positions astride the two nodal positions n2, n4 of the fourth order bending vibration B4 generated in the vibration element 11. In the above-described manner, the vibration element 11 is reliably restricted with respect to the vibration direction of the bending vibration B4 by the projecting units 36a, 36b. Further, the projecting units 36a, 36b are not necessarily disposed at positions which accurately coincide with the nodal positions n2, n4, and may be in the neighborhood of the nodal positions n2, n4.

As shown in FIG. 2, the projecting units 36a, 36b are disposed divided into two (2) with respect to the width direction of the vibration element 11 in order to avoid interference with the solder bulges 17a–17d, 17p, 17p'.

In accordance with the first embodiment of the invention, the restricting pins 34a, 34b, the compression support member 35, and the projecting units 36a, 36b, all preferably comprise aluminum alloy. Further, in order to prevent electrical short circuits from the piezoelectric member 13 to the projecting units 36a, 36b, the contact portions with the piezoelectric member 13 are resin coated.

Moreover, in accordance with the first embodiment of the invention, the restricting pins 34a, 34b and the compression support member 35 are formed with a clearance. However, these elements may be fitted so that the restricting pins 34a, 34b and the compression support member 35 do not have a clearance. Moreover, the restricting pins 34a, 34b, the compression support member 35, and the projecting units 36a, 36b may be integrally formed. By simplifying the structure of the compression support member 32, the manufacturing cost of the compression support member 32 can be reduced.

Furthermore, a blind hole, which is a mounting hole for the first compression generating member, may be disposed in the compression support member 35 in the center of the flat surface on the side opposite to the vibration element 11. A coil spring 33, which is a first compression generating member, is mounted between the mounting hole 38 of the first compression generating member and the roof surface of the casing 41. A spring force exerted by the coil spring 33 urges the compression support member 35 toward the vibration element 11. The urging force of the coil spring 33 and compression support member 35 causes the ends of the projecting units 36a, 36b disposed on the vibration element 11 side of the compression support member 35 to contact the vibration element 11.

In the above-described manner, the compression support mechanism 31 in accordance with the first embodiment of the present invention also functions as a fixed member to fix the vibration element 11 to the casing 41.

Moreover, in accordance with the first embodiment of the present invention, the compression support mechanism 31 comprises a first compression force generating member, which is preferably the coil spring 33 mounted between the compression support member 35 and the roof of the casing 41. Because of this arrangement, enlargement in size of the compression force generating member, which is an accessory of the ultrasonic actuator 10 of the first embodiment, can be suppressed as much as possible.

Moreover, in accordance with the first embodiment of the present invention, the compression support mechanism 31 includes the restricting pins 34a, 34b passing through and, in addition, includes the compression support member 35 on the side opposite to the side where the relative motion member 22 is located with respect to the vibration element 11 having projecting units 36a, 36b on both sides with respect to the direction of relative motion. Accordingly, the restricting pins 34a, 34b and the projecting units 36a, 36b are arranged with a simple structure, assembly is simplified, and simplification and size reduction of the compression support mechanism 31 are achieved. Moreover, support of the vibration element 11 and compression of the vibration element 11 onto the relative motion member 22 can be performed together.

Furthermore, in accordance with the first embodiment of the present invention, the compression support mechanism 31, as described hereinabove, has a very simple structure in which the compression support member 32 and the compression generating member 33 are assembled in a compact manner. Because of this, size reduction of the ultrasonic actuator 10 can be achieved. Moreover, the manufacturing cost can be reduced as much as possible.

In the above manner, the vibration element 11 is restricted in the vibration direction (the up and down direction in FIG. 1A) of the fourth order bending vibration B4, which is the second vibration, by the projecting units 36a, 36b disposed in the compression support member 35.

The casing 41, which comprises a base member, is a box-like receiving member including an assembly comprising an upper casing 41a and a lower casing 41b. The casing 41 includes aperture units 43a, 43b for the relative motion member 22 to pass through.

The restricting pins 34a, 34b are perpendicularly fixed in a roof surface of the upper casing 41a, facing toward the lower casing 41b. Moreover, as described above, six (6) conveyor rollers, including the conveyor rollers 23a, 23b, are located and freely rotatable in a predetermined position in the interior of the lower casing 41b. Furthermore, interference cushioning material 44, such as rubber, is mounted on the respective end surfaces of the upper casing 41a and the lower casing 41b, which border on the aperture units 43a, 43b.

A screw mechanism 45 is screw fixed in a portion of a roof plate of the upper casing 41a contacted by the coil spring 33. In a state in which the coil spring 33 contacts the screw mechanism 45, by changing the screw set position of the screw mechanism 45 with respect to the upper casing 41a, the length of the coil spring 33 is changed. The compressive force between the vibration element 11 and the relative motion member 22 is freely adjusted by adjusting the set position of the screw mechanism 45, thereby adjusting of the spring force generated by the coil spring 33.

In accordance with the first embodiment of the present invention, the casing 41 maintains and houses the vibration element 11 and compression support mechanism 31, in a manner such that the compression of the vibration element 11 to the relative motion member 22, and the movement of the relative motion member 22, is performed very simply and in a small space.

The ultrasonic actuator 10 in accordance with the first embodiment of the present invention is assembled according to the following operations.

(1) The relative motion member 22 is loaded on the six (6) conveyor rollers, including the conveyor rollers 23a, 23b, supported for free rotation in the lower casing 41b.

(2) The coil spring 33 is mounted in the first compression force generating member mounting hole 38 in the compression support member 35. The restricting pins 34a, 34b are then fixed perpendicularly to the roof surface of the upper casing 41a mount the compression support member 35 in the upper casing 41a to respectively pass through the through holes 37a, 37b in the compression support member 35.

(3) The restricting pins 34a, 34b, which pass through the through holes 37a, 37b, mount the vibration element 11 to the upper casing 41a such that the notches 11a, 11b in the vibration element 11 have a clearance.

(4) In a state in which the compression support member 35 and vibration element 11 are mounted in the upper casing 41a, as described in the above paragraphs (2) and (3), the upper casing 41a is placed on the lower casing 41b, and the upper casing 41a and the lower casing 41b are fixed by suitable means.

The conditions when driving the ultrasonic actuator 10 assembled in the above manner, will now be described below.

The A phase drive signal is input via lead wires 16a, 16c, and the B phase drive signal is input via lead wires 16b, 16d, to the vibration element 11. Thereupon, the vibration element 11 simultaneously generates a longitudinal vibration L1 which vibrates in a direction corresponding to the direction of relative motion, and a fourth order bending vibration B4 which vibrates in the direction of compression.

At this time, the bending vibration B4 causes the relative motion member 22 to receive pressure in its thickness direction from the vibration element 11, specifically, pressure in the compression direction. Because of the pressure received by the relative motion member 22, the restricting pins 34a, 34b fit in the notches 11a, 11b, centered on the notches 11a, 11b, and a couple arises as both ends in the length direction rise and fall in mutually opposite directions.

However, in accordance with the first embodiment of the invention, because the two (2) projecting units 36a, 36b are spaced apart in the length direction of the vibration element 11, and contact the vibration element 11, the projecting units 36a, 36b restrict the vibration element 11 in the vibration direction of the bending vibration B4. Moreover, because the restricting pins 34a, 34b couple to the vibration element 11 via the notches 11a, 11b, the restricting pins 34a, 34b restrict the vibration element 11 in the vibration direction of the longitudinal vibration L1. Because of this, the occurrence of a pitching vibration in the vibration element 11 is accurately suppressed or eliminated.

In particular, in accordance with the first embodiment of the invention, because the projecting units 36a, 36b contact the vibration element 11 in two places corresponding to the nodes n2, n4 of the fourth order bending vibration B4, the bending vibration B4 arising in the vibration element 11 is attenuated as little as possible, and the clutch effect of the bending vibration B4 can operate effectively. Accordingly, the drive force generated by the vibration element 11 can be efficiently transmitted to the relative motion member 22, and the drive force or driving efficiency of the ultrasonic actuator 10 can be increased.

Moreover, in accordance with the first embodiment of the invention, because the projecting units 36a, 36b restrict the vibration element 11 in the vibration direction of bending vibration B4 and simultaneously perform compression of the vibration element 11 to the relative motion member 22, it is not necessary to provide a member exclusively for compression purposes. In this manner, a complicated or bulky compression member is prevented.

Figure 22:
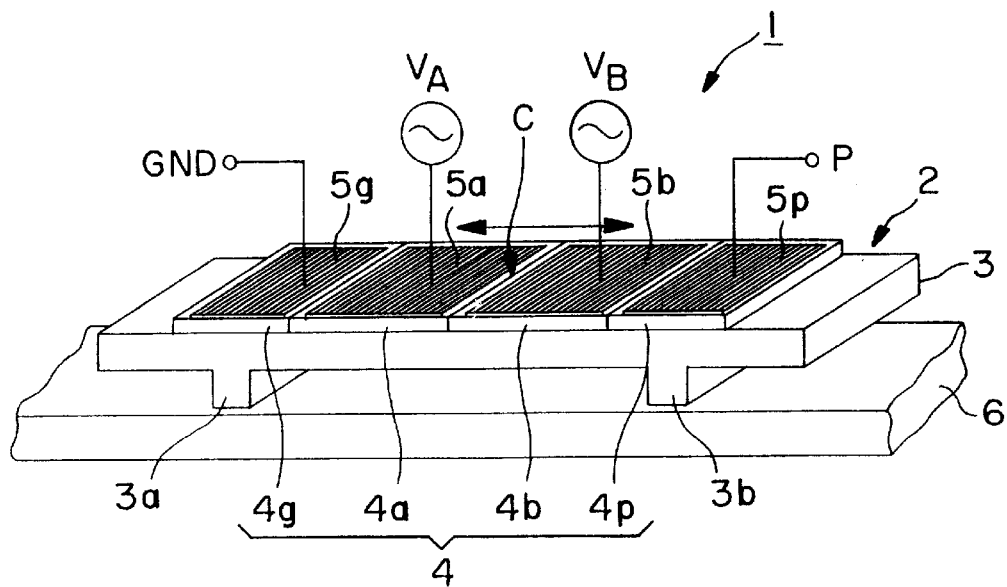
FIG. 22 is a perspective view of a prior art vibration actuator including a vibration element using degenerate modes of different form.
Figure 23:
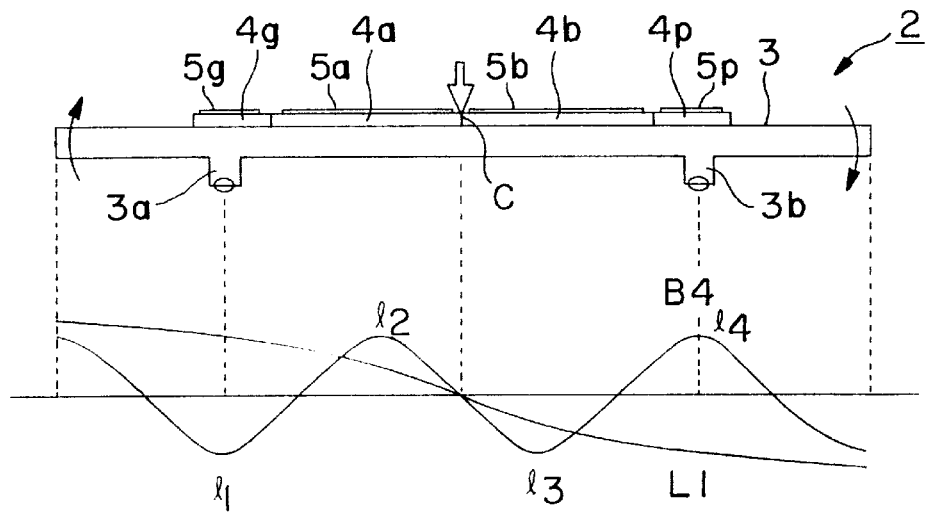
FIG. 23 is a diagram illustrating examples of a waveform of two vibrations generated in the vibration element shown in FIG. 22.

Furthermore, in accordance with the first embodiment of the present invention, vibration attenuation with respect to longitudinal vibration L1 accompanying compression is larger than the prior art examples shown in FIGS. 22 and 23. Further, in accordance with the first embodiment of the invention, the suppression or elimination of pitching vibration, the suppression of a reduction of driving efficiency, and the suppression of the respective vibration attenuation of the longitudinal vibration L1 and the bending vibration B4 accompanying compression, can be balanced at a high level. Because of this, in accordance with the first embodiment of the invention, the performance of the ultrasonic actuator 10 as a whole can be markedly increased.

For example, if the vibration attenuation accompanying compression is taken into account, it is most advantageous to suppress pitching vibration by compressing the endmost portions of the vibration element 11 length direction with the projecting units 36a, 36b. However, because the endmost portion is a position at which the amplitude of the longitudinal vibration L1 is large, there is concern regarding the vibration attenuation of the longitudinal vibration L1. The compression position of the present embodiment is of the invention set taking such vibration attenuation comprehensively into account.

Second Preferred Embodiment

A vibration actuator in accordance with a second preferred embodiment of the present invention will now be described below with reference to the accompanying drawings. Furthermore, elements which are the same as or similar to those described with respect to the first embodiment are referred to by the same reference symbols, and a detailed description of these like elements will not be repeated here.

Figure 5:
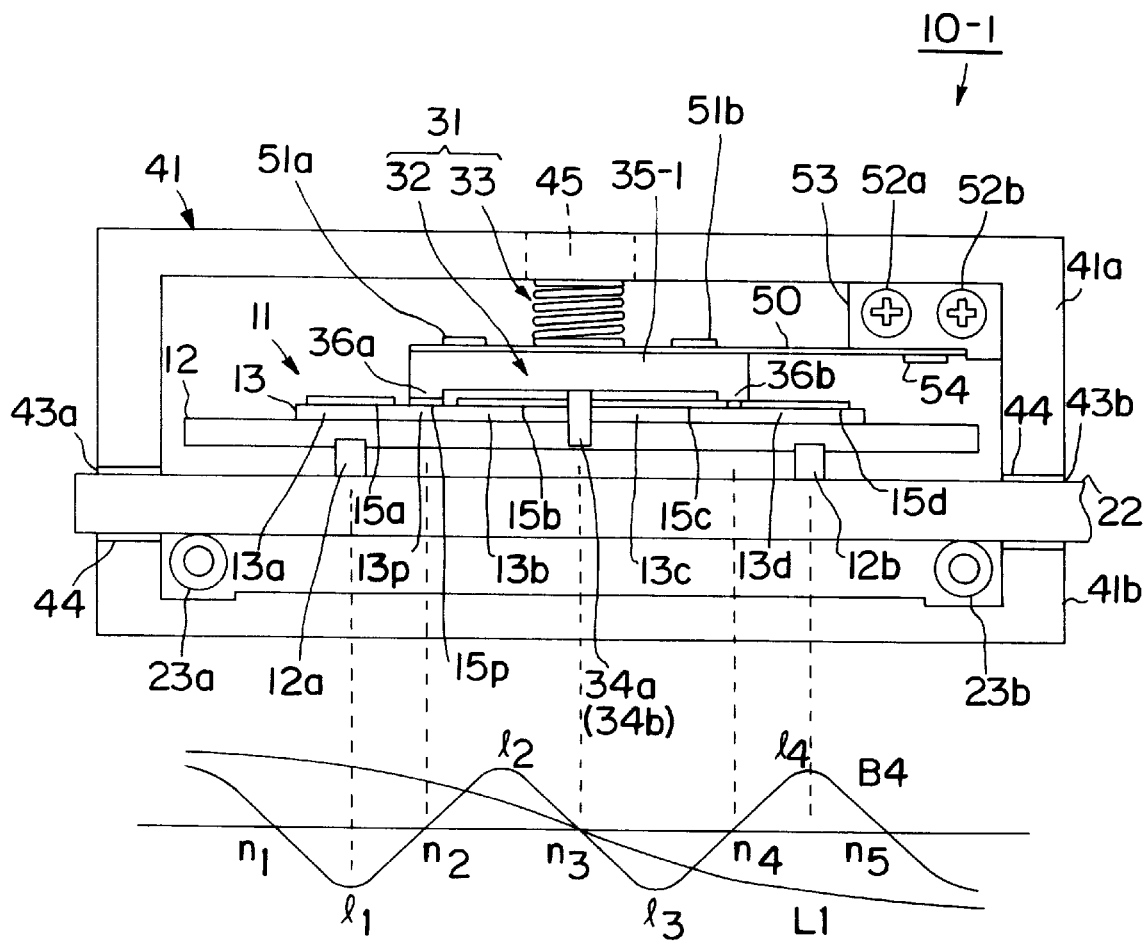
FIG. 5 is a diagram illustrating an ultrasonic actuator and an example of a generated vibration waveform in accordance with a second embodiment of the present invention.

FIG. 5 is a diagram illustrating a ultrasonic actuator 10-1 and an example of a waveform generated by the vibrations L1, B4. A difference between the first embodiment and the second embodiment is the structure of the compression support member 35-1 and components in the neighborhood thereof, and the form of the compression support member 35-1.

In accordance with the second embodiment of the present invention, one end of a thin, laminar coupling member 50 is fixed to the upper surface of the compression support member 35-1. The coupling member 50 is extended in the direction of relative motion, and is fixed to the upper surface of the compression support member 35-1 via screws 51a, 51b. Another end of the coupling member 50 is tightly fixed by a screw 54 to a lower surface of a bracket 53 which is tightly fixed by screws 52a, 52b to a corner portion of the roof plate of the upper casing 41a. Moreover, the coil spring 33 is mounted in an interposed state between the upper surface of the coupling member 50 and the roof surface of the upper casing 41a.

Furthermore, in accordance with the second embodiment, the restricting pins 34a, 34b are fixed perpendicularly in the lower surface of the compression support member 35-1, and fit with clearance into the notches 11a, 11b of the vibration element 11.

Other than the above-described details, the construction of the ultrasonic 10-1 in accordance with the second embodiment of the present invention is the same as that of the ultrasonic actuator 10 described with respect to the first embodiment of the present invention.

In accordance with the second embodiment of the present invention, because the compression support member 35-1 is fixed to the upper casing 41 via the coupling member 50, the accuracy with which the compression support member 35-1 restricts in the corresponding motion direction of the vibration element 11 is greater than that of the first embodiment. Moreover, because the restricting pins 34a, 34b are fixed in the compression support member 35-1, the play between the restricting pins 34a, 34b and the compression support member 35 which exists in accordance with the first embodiment does not exist in the second embodiment. Because of this, the restricting action in the direction of relative motion of the vibration element 11 by the compression support member 35-1 increases. Accordingly, the driving efficiency and drive force of the ultrasonic actuator 10-1 are greater than those of the first embodiment.

Moreover, because the coupling member 50 comprises a thin, laminar, elastic member, the coupling member 50 deforms flexurally centered on the fixing position by the bracket 53. Because of this, the compression support member 35-1 can deform minutely in an about rectilinear form in the direction of compression. Therefore, in accordance with the second embodiment of the present invention, the generation of a pitching vibration in the vibration element 11 can be reliably suppressed or eliminated in a manner similar to the first embodiment.

Third Preferred Embodiment

In accordance with the first and second embodiments of the present invention, the restricting pins 34a, 34b, and compression support member 35 or 35-1, and projecting units 36a, 36b, all of aluminum alloy. In contrast to these, in accordance with the third embodiment of the present invention, these members comprise methacrylic resin obtained by the polymerization of a methacrylic acid ester.

More specifically, as shown in FIGS. 1 . 5, because the positions at which the projecting units 36a, 36b come into contact with the vibration element 11 are nodes of the bending vibration B4, the bending vibration B4 is not attenuated by the projecting units 36a, 36b. However, these contact positions are greatly displaced from the node n3 of the longitudinal vibration L1, and the projecting units 36a, 36b cause attenuation of the longitudinal vibration L1. Accordingly, in order to attenuate the longitudinal vibration L1 as little as possible, it is desirable that the projecting units 36a, 36b comprise a material whose frictional force with the contacting vibration element 11 is as small as possible. Moreover, it is desirable that the projecting units 36a, 36b comprise a material having a high vibration attenuating power, in order to cause attenuation of pitching vibrations occurring in the vibration element 11.

In accordance with the third embodiment of the invention, in the above-described manner, methacrylic resin is selected as a material having low frictional force with respect to the vibration element 11 and also large vibration attenuating power. Accordingly, even when compressing the compression support member 35, 35-1 comprising of methacrylic resin with the coil spring 33, the deformation arising in the compression support member 35, 35-1 is small. Because the deformation of the support member 35, 35-1 is small, the compressive force can be reliably transmitted to the vibration element 11 via the projecting units 36a, 36b, and the vibration element 11 can be reliably restricted in the vibration direction of the bending vibration B4.

Moreover, the projecting units 36a, 36b comprising methacrylic resin have good contact slip with respect to the vibration element 11, and can make the vibration attenuation of the longitudinal vibration L1 as small as possible.

Furthermore, because resin materials such as methacrylic resin have high vibration attenuating power in comparison with metallic materials, it becomes fundamentally difficult to generate pitching vibrations. Accordingly, the clutch mechanism of the bending vibration B4 can operate effectively, and the drive force generated by the vibration element 11 can be transmitted efficiently to the relative motion member 22. Because of this, the drive force and driving efficiency of the ultrasonic actuator 10 are increased.

Furthermore, other than methacrylic resins, the projecting units 36a, 36b may comprise (1) thermosetting phenolic resins (phenol-formaldehyde) obtained by the condensation reaction of phenols and aldehydes, (2) polyamide resins, nylon-6 from the polymerization of $\epsilon$-caprolactam, nylon 66, the condensation product of adipic acid and hexamethylene diamine, and the like, (3) polytetrafluoroethylene (PTFE), fluoroethylene-propylene (FEP) and the like fluoro resins, (4) polyacetal resins, (5) acrylonitrile-butadiene copolymer resins (ABS resins), (6) polyimide resins, which are polycondensates derived from pyromellitic acid dianhydride and aromatic diamines, (7) polyethylene resins, which are thermoplastics obtained by the polymerization of ethylene, (8) polyvinyl chloride (PVC), polycarbonate resins, which are polymers derived from the direct reaction of phosgene with aromatic and aliphatic dihydroxy compounds, or by ester interchange reactions with phosgene derivatives, (10) polypropylene resins, which are thermoplastics obtained by the polymerization of polypropylene using suitable solvents, (11) polystyrene resins, which are thermoplastics obtained by the polymerization of styrene, (12) epoxy resins, which are thermosetting resins obtained by causing the condensation of epoxy compounds with compounds which have active hydrogen atoms. The above materials are as examples, and may be used singly or in combination. Similar effects to those with methacrylic resins are obtained with any of the above resins.

Moreover, it is not necessary for the restricting pins 34a, 34b, compression support member 35, 35-1, and projecting units 36a, 36b to all respectively comprise the above materials, and the above materials may be used in only those portions which come into contact with the vibration element 11.

Fourth Preferred Embodiment

Figure 6:
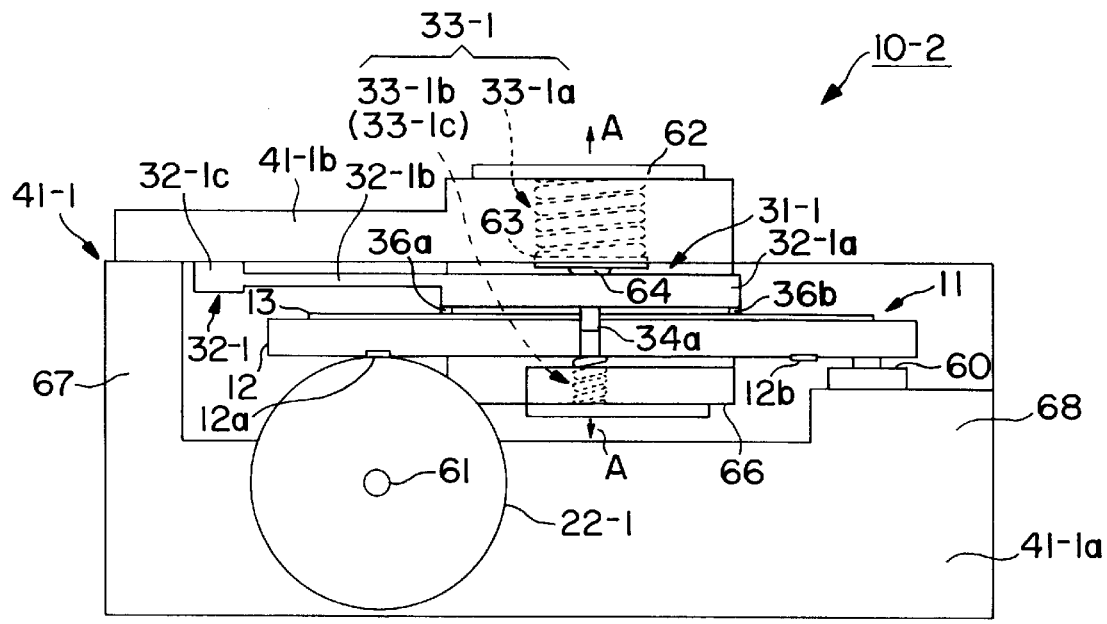
FIG. 6 is a front view of an ultrasonic actuator in accordance with a fourth embodiment of the present invention.
Figure 7:
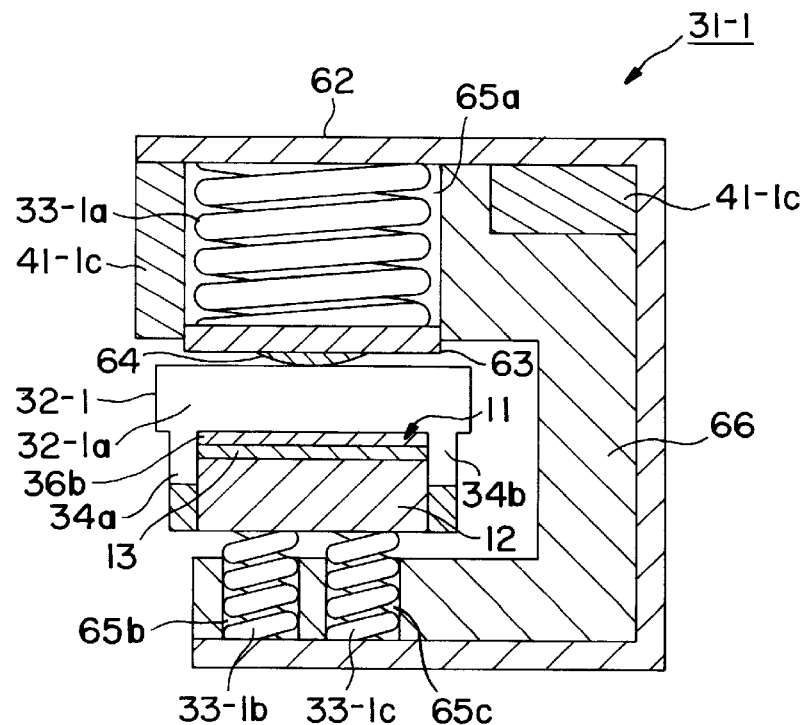
FIG. 7 is a cross-sectional diagram of a compression support mechanism taken along a cross section VI—VI of FIG. 6 in accordance with the fourth embodiment of the present invention.

FIG. 6 is a front view of an ultrasonic actuator 10-2 in accordance with a fourth preferred embodiment of the present invention. FIG. 7 is a cross sectional diagram of a compression support mechanism in a cross section VII—VII of FIG. 6.

As shown in FIG. 6, the ultrasonic actuator 10-2 in accordance with the fourth embodiment of the invention includes a vibration element 11 to generate a first order longitudinal vibration L1, which is a first vibration and a fourth order bending vibration B4, which is a second vibration; a relative motion member 22-1, which is a rotary member; a compression support mechanism 31-1; a compressive force generation unit 33-1; and a casing 41-1, which houses the vibration element 11 and a compression support mechanism 32-1 and in addition supports the relative motion member 22-1 for free rotation. The above elements are described in detail hereinbelow with reference to FIGS. 6 and 7.

The vibration element 11 in accordance with the sixth embodiment of the present invention is the same as the vibration element 11 described with respect to the first through third embodiments, and a detailed description of the vibration element 11 will not be repeated here.

The vibration element 11 includes an elastic member 12 having a rectangular plate form, a piezoelectric member 13 mounted on one flat side of the elastic member 12, and two drive force output members 12a, 12b respectively comprising two sliding members. A first order longitudinal vibration L1 and a fourth order bending vibration B4 are generated in the vibration element 11 in accordance with input drive signals. An elliptical motion, which is the combination of the longitudinal vibration L1 and the bending vibration B4, is thereby generated at the end surfaces of the drive force output members 12a, 12b.

In accordance with the fourth embodiment, one side of the vibration element 11 is disposed in the bottom portion 41-1a of the casing 41-1, and is supported and compressively brought into contact by a fixed member 60, which is a third restriction member. Moreover, an end surface of one side drive force output member 12a among the drive force output members 12a, 12b is compressively contacted by the outer circumferential face of the relative motion member 22-1, which is described in more detail hereinafter. Furthermore, the other drive force output member 12b does not come into contact with another member, and drive force is not transmitted here.

The fixed member 60 corresponds to a nodal position n5 of the outside of the bending vibration B4 generated in the vibration element 11, and can suppress the vibration attenuation of the bending vibration B4. However, because the fixed member 60 is separated from the nodal position n3 of the longitudinal vibration L1 generated in the vibration element 11, the fixed member 60 is a primary factor in causing attenuation of the longitudinal vibration L1. Accordingly, in order for the restricting pins 34a, 34b, the compression support member 35 or 35-1, and the projecting units 36a, 36b, to not attenuate the longitudinal vibration as much as possible, in a manner similar to the third embodiment, it is desirable that the material of the fixed member 60 is such that the frictional force with respect to the vibration element 11 is as small as possible. Moreover, when a material having high vibration attenuation is used, the pitching vibration which arises in the vibration element 11 can be attenuated. Consequently, in accordance with the fourth embodiment of the invention, the fixed member 60 is formed of polyacetal resin. By forming the fixed member of polyacetal resin, the contact slip between the vibration element 11 and the fixed member 60 is good, and the attenuation of the longitudinal vibration L1 can be kept to a minimum.

Furthermore, the fixed member 60 can be formed of materials other than polyacetal resin. For example, the fixed member can be respectively formed of each of the materials disclosed in accordance with the third embodiment, and results similar to those obtained with polyacetal resin can be obtained with these materials. For example, the fixed member 60 may comprise methacrylic resin, phenolic resin, nylon-6 or nylon-66 polyamide resins, PTFE or FEP fluoro resins, ABS resin, polyimide resin, polyethylene resin, PVC, polycarbonate resin, polypropylene resin, polystyrene resin, epoxy resin, and the like.

Moreover, in FIGS. 6 and 7, the electrode plates, lead wires, and the like elements in the vibration element 11 have been omitted in order to simplify the figures and the description.

The relative motion member 22-1 in accordance with the fourth embodiment of the invention is a roller, supported to rotate freely with the shaft support unit 61 as center, disposed in the bottom portion 41-1a of the casing 41-1. As described above, the outer circumference of the relative motion member 22-1 is in compressive contact with the end face of the drive force output member 12a disposed in the vibration element 11. Accordingly, when drive signals are input to the vibration element 11, the relative motion member 22-1 is rotationally driven in one direction, centered on the shaft support unit 61.

As shown in FIGS. 6 and 7, in accordance with the fourth embodiment of the invention, the compression support mechanism 31-1 comprises a compression support member 32-1 which performs restriction of the vibration element 11, a compression force generating member 33-1 which urges the vibration element 11 toward the relative motion member 22-1, a compression support mechanism frame 62 which houses the compression support member 32-1 and the compression force generating member 33-1. The compression support mechanism 31-1 elements will be described in detail hereinbelow.

Figure 8A:
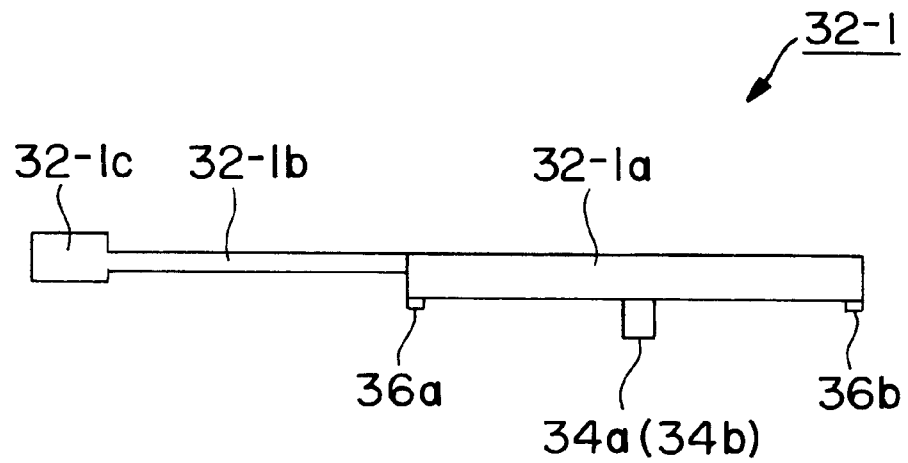
FIGS. 8A–8B illustrate a front view and lower surface view, respectively, of a compression support member in accordance with the fourth embodiment of the present invention.
Figure 8B:
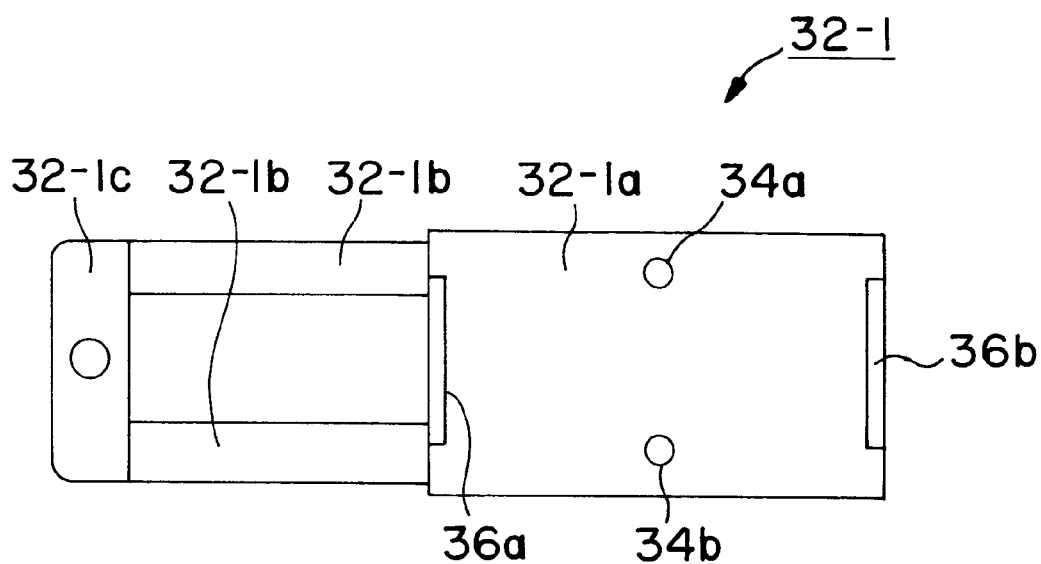

FIG. 8 is a diagram illustrating the compression support member 32-1 in accordance with the fourth embodiment of the invention. More particularly, FIG. 8A is a front view of the compression support member 32-1, and FIG. 8B is a lower surface view of the compression support member 32-1.

The compression support member 32-1 comprises, integrally formed, a compression support unit 32-1a, and two (2) coupling members 32-1b disposed in one end of the length direction of the compression support unit 32-1a, and a fixed unit 32-1c which is disposed in the two (2) coupling members 32-1b.

The compression support unit 32-1a has a rectangular plate form. Projecting units 36a, 36b are disposed perpendicularly in the neighborhood of both end surfaces of a flat face in the length direction of the compression support unit 32-1a. Moreover, restricting pins 34a, 34b are disposed in the center portion of the length direction of the flat face, fitting with clearance in the notches 11a, 11b in the vibration element 11. The arrangement positions of the projecting units 36a, 36b and the restricting pins 34a, 34b are the same as described above with respect to the second embodiment of the invention as regards dimensions, function, etc.

The coupling member 32-1b has a laminar form, similarly to the coupling member 50 described with respect to the second embodiment, and can undergo bending deformation centered on the fixed member 32-1c. Accordingly, the compression support unit 32-1a is able to minutely deform in the compression direction in an about rectilinear manner. Moreover, the fixed unit 32-1c is a fixed unit when the compression support member 32-1 is fixed to the casing 41-1.

The compression force generation member 33-1 in accordance with the fourth embodiment of the invention comprises a coil spring 33-1a, which is a first compressive force generation member, and coil springs 33-1b and 33-1c, which are second compressive force generation members.

The coil spring 33-1a has one end mounted on a roof surface of the compression support mechanism frame 62. The other end of the coil spring 33-1a is disposed in a compression force transmission member 63. The roof surface, which is the mounting portion of the coil spring 33-1a, is a screw setting screw mechanism (not shown in the drawing). By changing the screw stop position of the screw mechanism, the spring force generated by the coil spring 33-1a generates can be changed. The spring force generated by the coil spring 33-1a urges a spherical compression unit 64 disposed in the compression force transmission member 63 toward the vibration element 11.

On the other hand, the coil springs 33-1b and 33-1c each have one end fixed to the bottom surface of the compression support mechanism frame 62. The respective other ends of the coil springs 33-1b and 33-1c are in contact with the vibration element 11. The vibration element 11 is urged toward the compression support member 32-1 by the spring force generated by the coil springs 33-1b and 33-1c.

In accordance with the fourth embodiment of the present invention, by this means, the vibration element 11 is restricted in the vibration direction of the longitudinal vibration L1, and, in addition, the vibration element 11 is restricted in the vibration direction of the bending vibration B4.

Furthermore, grounding of the piezoelectric member 13 disposed on the vibration element 11 to the compression support mechanism frame 62 is performed via the coil spring 33-1b and the coil spring 33-1c.

As shown in FIGS. 6 and 7, in accordance with the fourth embodiment of the present invention, the compression support member 32-1 and the compression force generation member 33-1 are together housed by the compression support mechanism frame 62 which has a cross-sectional shape of a groove form.

A molded body 66 having concave portions 65a, 65b and 65c is mounted in the interior of the compression support mechanism frame 62. The coil springs 33-1a, 33-1b and 33-1c are housed in predetermined positions in the respective concave portions 65a, 65b and 65c. The compression support member 32-1 and the vibration element 11 are arranged between the coil spring 33-1a and the coil springs 33-1b and 33-1c.

In accordance with the fourth embodiment of the invention, because the vibration element 11, the compression support member 32-1, and the compressive force generating member 33-1 are assembled as a unit, using the compression support mechanism frame 62, it is unnecessary to mount the vibration element 11, the compression support member 32-1, and the compression force generating support member 33-1 separately in the casing 41-1. Because of this, the compression support mechanism frame 62 which houses the vibration element 11, compression support member 32-1 and compressive force generating mechanism frame 62 may be mounted to the casing 41-1. In the above-described manner, the ease of assembly of the ultrasonic actuator 10-2 is markedly improved.

In accordance with the fourth embodiment of the present invention, the casing 41-1 comprises a bottom casing 41-1a and a roof plate 41-1b. Specifically, a roof plate fixing unit 67 and a fixing member fixing unit 68 are disposed in the bottom plate 41a, at both ends of the relative motion direction.

Moreover, the roof plate 41-1b is fixed by suitable means to the roof plate fixing unit 67. In a predetermined position of the roof plate 41-1b, the fixing unit 32-1c of the compression support member 32-1 is fixed to the compression support mechanism frame 62.

As shown in FIG. 7 in order for the end of the roof plate 41-1b to prevent interference of the coil spring 33-1a and the molded body 66 loaded in the compression support mechanism frame 62, the end of the roof plate 41 is divided into two divided portions 41-1c. The compression support mechanism frame 62 is supported by the divided portions 41-1c.

The ultrasonic actuator 10-2 in accordance with the fourth embodiment of the present invention is assembled by the following operations (1)–(3).

(1) In a state in which the restricting pins 34a, 34b of the compression support member 32-1 are fitted into the notches 11a, 11b of the vibration element 11, the compression support mechanism 31-1 is constituted by housing the compression support member 32-1 and compression force generating member 33-1 as a unit in the compression support mechanism frame 62.

(2) By fitting the two divided portions 41-1c of the roof plate 41-1b into predetermined portions of the compression support mechanism frame 62, the compression support mechanism 31-1 is fixed in the roof plate 41-1b via the fixing member 32-1c of the compression support member 32-1.

(3) The roof plate 41-1b, which fixes the compression support mechanism 31-1, is fixed in the bottom plate 41-1a which shaft 61 supports the relative motion member 22-1.

In the above-described manner, in accordance with the fourth embodiment of the present invention, because the compression support member 32-1, the compression force generating member 33-1, and the vibration element 11 are formed as a unit by the compression support mechanism frame 62, the ease of assembly of the ultrasonic actuator 10-2 is markedly increased.

Moreover, in accordance with the fourth embodiment of the present invention, the form of the compression support member 32-1 is simplified in comparison with that of the first through third embodiments. Accordingly, the driving efficiency and drive force of the ultrasonic actuator 10-2 is increased. Moreover, the ultrasonic actuator 10-2 can be manufactured inexpensively.

Fifth Preferred Embodiment

Figure 9A:
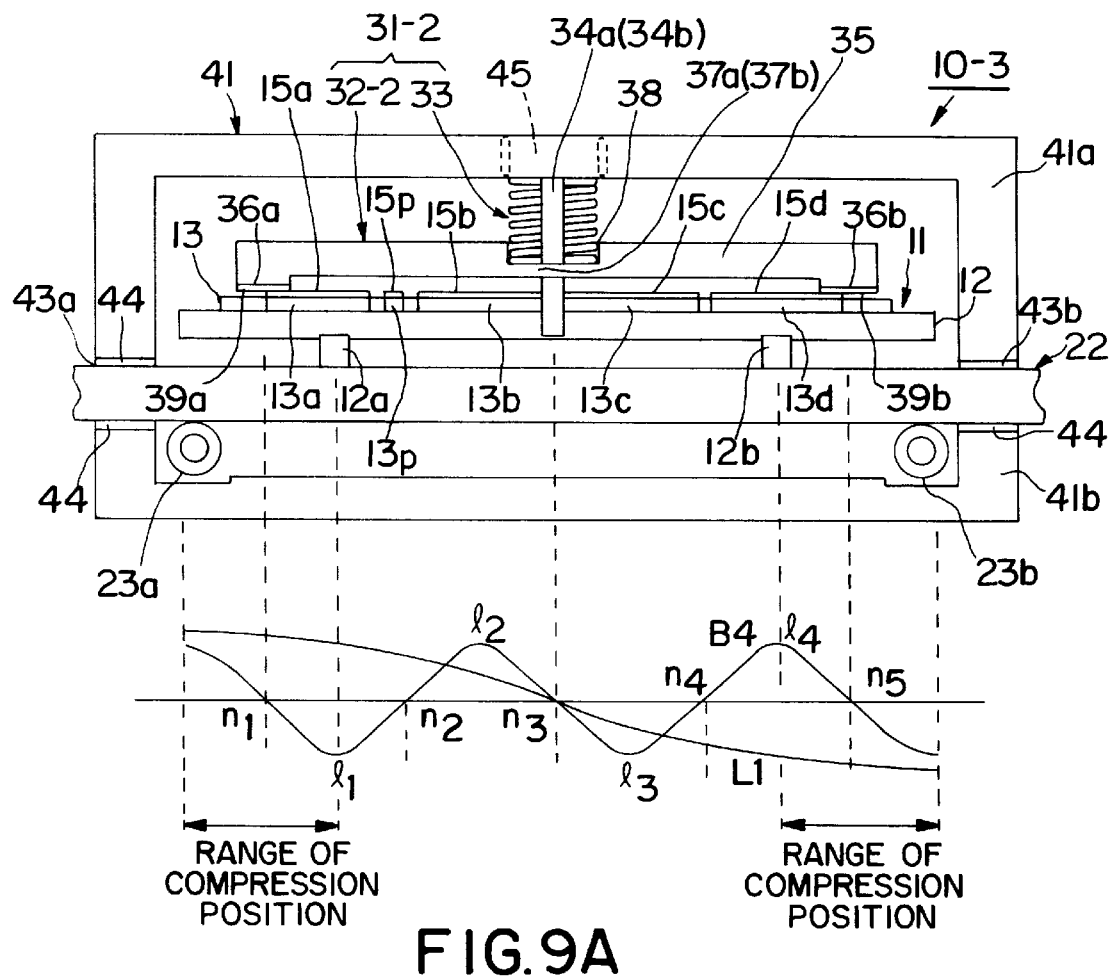
FIG. 9A is a diagram illustrating an ultrasonic actuator and an example of a generated vibration waveform in accordance with a fifth embodiment of the present invention.
Figure 9B:
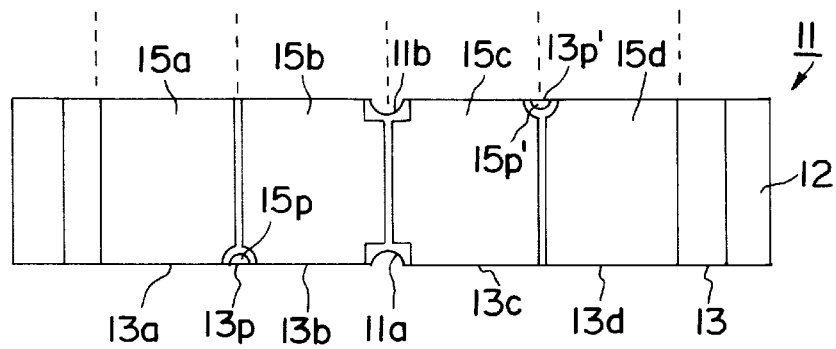
FIG. 9B is a top view showing a vibration element of an ultrasonic actuator in accordance with the fifth embodiment of the present invention.

FIG. 9 is an illustrative diagram of the ultrasonic actuator 10-3 in accordance with a fifth preferred embodiment of the present invention. More particularly, FIG. 9A is a diagram illustrating the ultrasonic actuator 10-3 and an example of a generated vibration waveform. FIG. 9B is a top view of a vibration element 11 of the ultrasonic actuator 10-3. Moreover, FIG. 10 is a perspective view of the ultrasonic actuator 10-3 in accordance with the fifth embodiment of the present invention.

Figure 10:
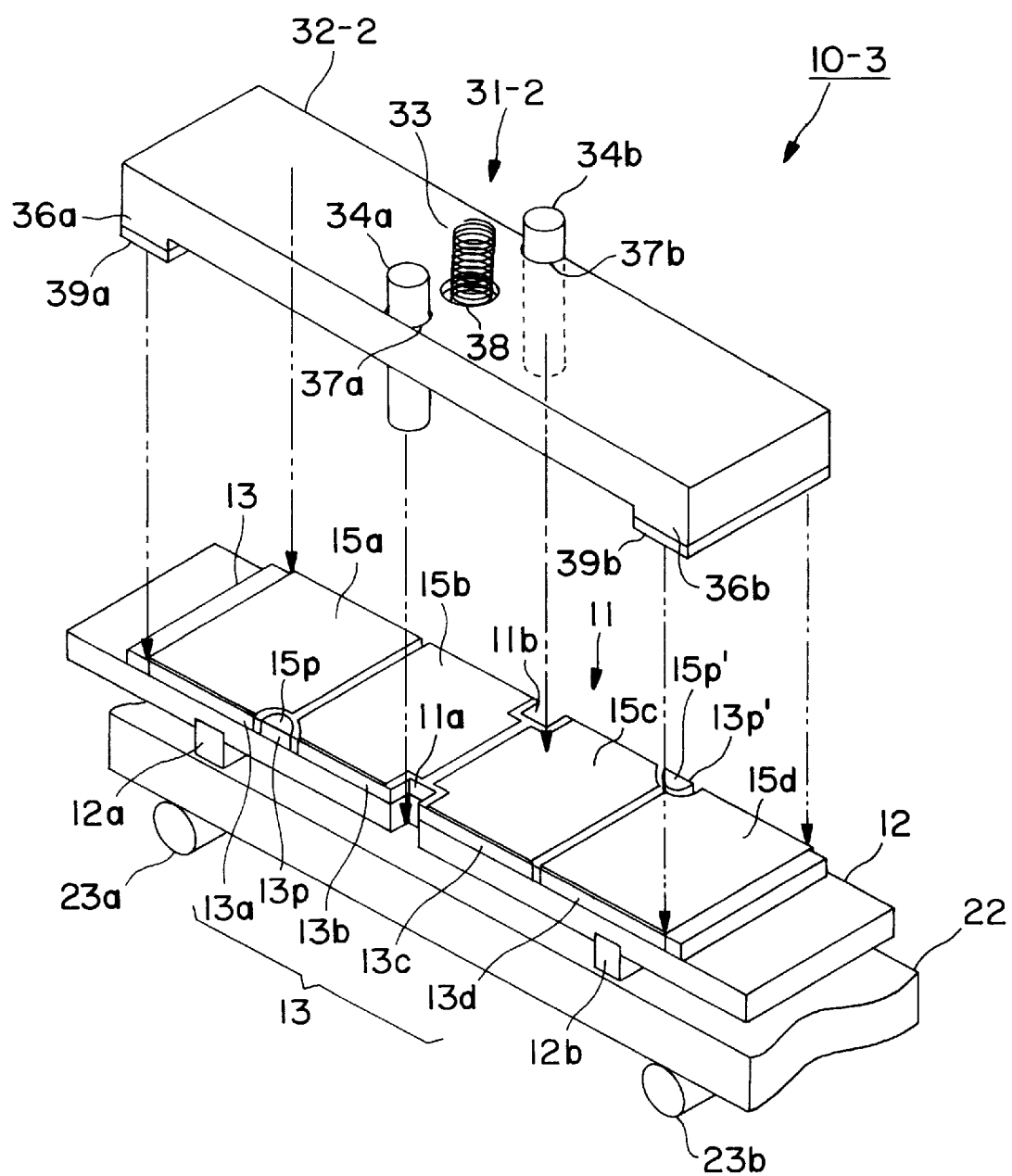
FIG. 10 is a perspective view of the ultrasonic actuator in accordance with the fifth embodiment of the present invention.

As shown in FIGS. 9 and 10, the ultrasonic actuator 10-3 in accordance with the fifth embodiment includes a vibration element 11, a relative motion member 22, a compression support mechanism 31-2, and a casing 41 which maintains the vibration element 11 and the compression support mechanism 31-2, and through which the relative motion member 22 passes. Among these elements, the vibration element 11, the relative motion member 22 and the casing 41, are the same as the first embodiment of the invention, and are referred to by the same reference symbols, and a detail description of these elements will not be repeated.

Compression support mechanism 31-2

As shown in FIGS. 9 and 10, the compression support mechanism 31-2 in accordance with the fifth embodiment of the present invention, includes a compression support member 32-2 which presents a longitudinal cross section having the form of a groove, and a coil spring 33, which is a first compression force generating member, mounted in about the center of the upper surface of the compression support member 32-2.

Projecting units 36a, 36b are formed in both ends of the length direction of the compression support member 32-2, protruding in the direction of the vibration element 11, which comprise a second restriction member. The vibration element 11 is compressed toward the relative motion member 22 by the projecting units 36a, 36b.

As shown in FIG. 9A, the projecting units 36a, 36b are formed, relative to the corresponding direction of motion, in a position more toward the ends of the vibration element 11 than the drive force output members 12a, 12b. More particularly, in accordance with the fifth embodiment of the invention, the projecting units 36a, 36b are positioned to coincide with the nodal positions n1, n5 of the fourth order bending vibration B4. By positioning the projecting units 36a, 36b to coincide with the nodal positions n1, n2, the vibration of the bending vibration B4 is not attenuated accompanying the compression of the vibration element 11 by the projecting units 36a, 36b. Furthermore, the projecting units 36a, 36b may be disposed in the neighborhood of the nodal positions n1, n5 of the bending vibration B4, with a decrease, to some degree, of the vibration attenuation effect.

Moreover, vibration absorbing materials 39a, 39b comprising, for example, felt, or the like material which easily absorbs vibration, are affixed in the contact surface of the projecting units 36a, 36b with the vibration element 11. The vibration absorbing material 39a, 39b prevents the generation of noise due to the projecting units 36a, 36b coming into contact with the vibration element 11. Furthermore, even if the vibration absorbing materials 39a, 39b are not disposed, the whole compression support member 32-2 may be formed by the vibration absorbing material.

Furthermore, in a manner similar to the third embodiment, the whole compression support member 32-2 including the projecting units 36a, 36b, for example, may be formed of one or more of polyacetal resin, methacrylic resin, phenolic resin, polyamide resin, fluoro resin, ABS resin, polyimide resin, polyethylene resin, PVC, polycarbonate resin, polypropylene resin, polystyrene resin, and epoxy resin.

A mounting hole 38, through which the coil spring 33 does not pass, is disposed in the center portion of the flat surface of the compression support member 32-2 on the side opposite to the vibration element 11. The coil spring 33 is mounted in the coil spring mounting hole 38. A compressive force is generated by the coil spring 33 and compresses the vibration element 11 toward the relative motion member 22. The generated compression force is transmitted to the vibration element 11 via the compression support member 32-2.

Furthermore, the restricting pins 34a, 34b pass through through holes 37a, 37b in the compression support member 32-2 fixed in the casing 41. The restricting pins 34a, 34b which pass through the through holes 37a, 37b fit with clearance into semicircular concave portions 11a, 11b having a notch form in both sides of the center of the length direction of the vibration element 11. Accordingly, the vibration element 11 can move freely in the compression direction, and is restricted having clearance with respect to the direction of relative motion.

The operation of driving the ultrasonic actuator 10-3 in accordance with the fifth embodiment of the present invention will now be described below.

The vibration element 11 generates relative motion with respect to the relative motion member 22, and a compressive force is generated from the vibration element 11 toward the relative motion member 22 as a result of the bending vibration B4 generated in the drive force output members 12a, 12b. A reaction force to the generated compressive force causes a couple to be generated which causes the two ends of the vibration element 11 in the length direction to rise and fall in mutually opposite directions, centered on the restricting pins 34a, 34b in the vibration element 11, as shown in FIG. 9A.

In accordance with the fifth embodiment of the invention, to compress with the projecting units 36a, 36b of the compression support member 32-2 the end portions in the length direction of the vibration element 11 by the drive force output members 12a, 12b, the couple can be more effectively suppressed than in the first through fourth embodiments. Therefore, the pitching vibration which causes both end portions in the length direction of the vibration element 11 to rise and fall in mutually opposite directions can be reliably suppressed or eliminated.

In accordance with the fifth embodiment of the invention, the noise due to the pitching vibration can be reduced. Moreover, the clutch function performed by the bending vibration can operate effectively, and the drive force of the vibration element 11 can be transmitted with good efficiency to the relative motion member 22. Therefore, in accordance with the fifth embodiment of the invention, the drive force and driving efficiency of the ultrasonic actuator 10-3 can be increased.

Moreover, in accordance with the fifth embodiment of the present invention, because the compression of the vibration element 11 toward the relative motion member 22 is also performed by the projecting units 36a, 36b, it is not necessary to provide a member exclusively for compression purposes. In this manner, the complication or bulkiness of the compression member are prevented.

Furthermore, the fifth embodiment of the present invention provides vibration attenuation accompanying compression with respect to the longitudinal vibration L1 which is larger in comparison with the prior art cases shown in FIGS. 22 and 23. However, by accordance with the fifth embodiment of the invention, the suppression or elimination of pitching vibration, and the suppression of a reduction of driving efficiency, and the suppression of the respective vibration attenuation of the longitudinal vibration L1 and the bending vibration B4 accompanying compression, can be balanced at a high level. Therefore, in accordance with the fifth embodiment, the performance of the ultrasonic actuator 10-3 as a whole can be caused to markedly increase.

Sixth Preferred Embodiment

Figure 11:
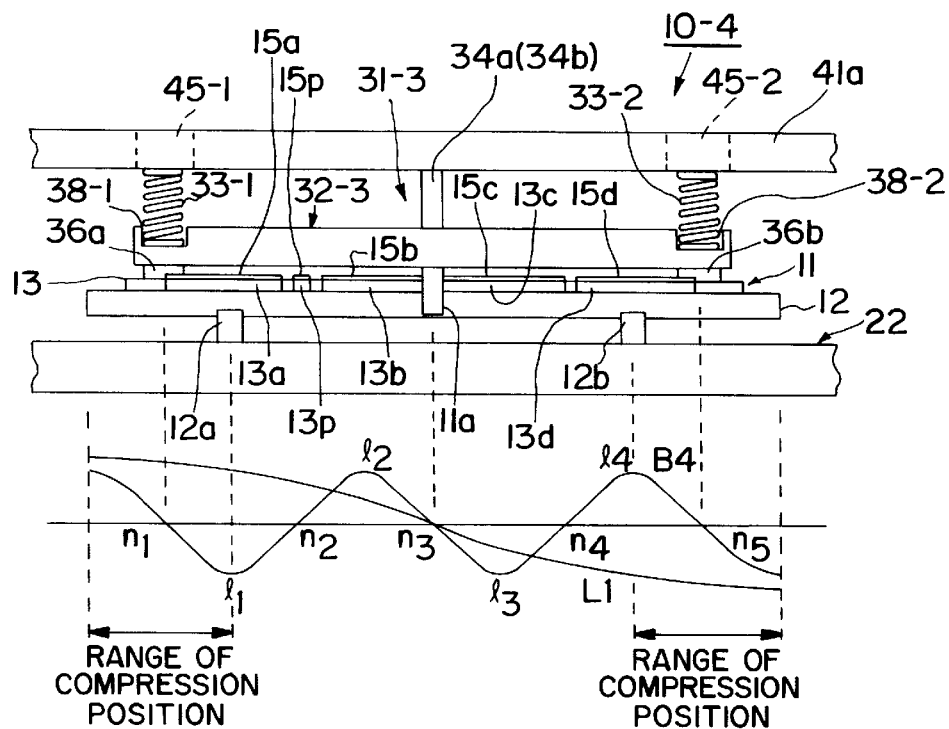
FIG. 11 is a diagram illustrating an ultrasonic actuator and an example of a generated vibration waveform in accordance with a sixth embodiment of the present invention.

FIG. 11 is a diagram illustrating an ultrasonic actuator 10-4 and a generated vibration waveform in accordance with a sixth preferred embodiment of the present invention. Omitted portions of the vibration actuator are the same as shown in FIG. 9A.

The sixth preferred embodiment differs from the fifth embodiment of the invention in that coil springs 33-1, 33-2, respectively, are used to compress the compression support member 32-3.

Coil spring mounting holes 38-1, 38-2 are disposed in the same positions as the positions compressed by the projecting units 36a, 36b, and coinciding with the nodal positions n1, n5 of the bending vibration B4. Further, the coil spring mounting holes 38-1, 38-2 are located in the compression support member 32-3 with respect to the length direction more toward the vibration element 11 ends than the drive force output members 12a, 12b of the vibration element 11.

Moreover, screw mechanisms 45-1, 45-2 are disposed in positions at which the coil springs 33-1, 33-2 contact the upper casing 41a.

In accordance with the sixth embodiment of the present invention, effects can be achieved which are the same as those described with respect to the fifth embodiment. Furthermore, because two coil springs 33-1, 33-2 are used, the pitching vibration accompanying driving can be more reliably suppressed. Moreover, by independently adjusting the compressive force generated by the coil springs 33-1, 33-2, left and right differences of drive force which accompany rotations of the drive direction can also be adjusted.

Seventh Preferred Embodiment

Figure 12:
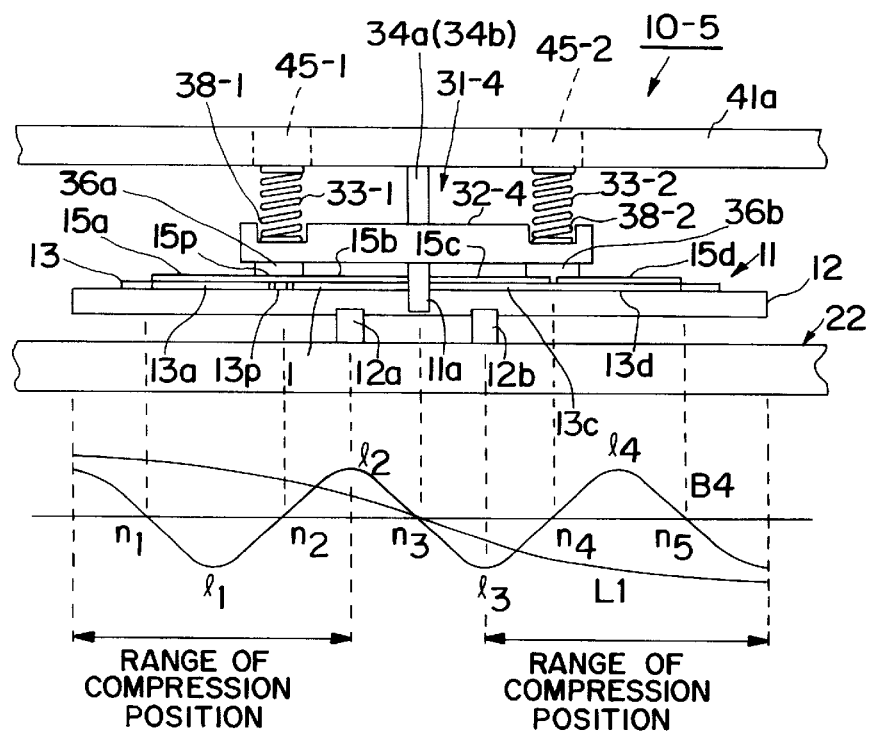
FIG. 12 is a diagram illustrating an ultrasonic actuator and an example of a generated vibration waveform in accordance with a seventh embodiment of the present invention.

FIG. 12 is a diagram illustrating an ultrasonic actuator 10-5 and an example of a generated vibration waveform in accordance with a seventh preferred embodiment of the present invention.

The seventh preferred embodiment is a modification of the sixth embodiment, and differs from the sixth embodiment at least in that the positions at which the drive force output members 12a, 12b are formed are different.

In accordance with the seventh embodiment of the invention, the drive force output members 12a, 12b are respectively located at inner antinode positions of the bending vibration B4. Furthermore, the compression position due to the projecting units 36a, 36b coincides with the nodal positions n2, n4 of the bending vibration B4, which are more toward the vibration member 11 ends than the drive force output members 12a, 12b.

In accordance with the seventh embodiment of the present invention, because the drive force output members 12a, 12b are located toward the center in the length direction of the vibration element, interference with amplitude components of the longitudinal vibration L1 becomes small. However, because the distance between the drive force output members 12a, 12b has become small, the flatness of the drive force output members 12a, 12b can increase.

Accordingly, driving efficiency increases, and a design is possible which prevents the generation of noise originating because of insufficient flatness of the drive force output members 12a, 12b. Furthermore, because the drive force output members 12a, 12b are brought close, manufacture in order to maintain flatness can be simplified, and, the design can reduce the manufacturing cost.

Furthermore, as shown in FIG. 12, the compression positions by the projecting units 36a, 36b may be located to coincide with the nodal positions n1, n5 of the bending vibration B4, and the effect of control of the pitching vibration can be further increased.

Eighth Preferred Embodiment

Figure 13:
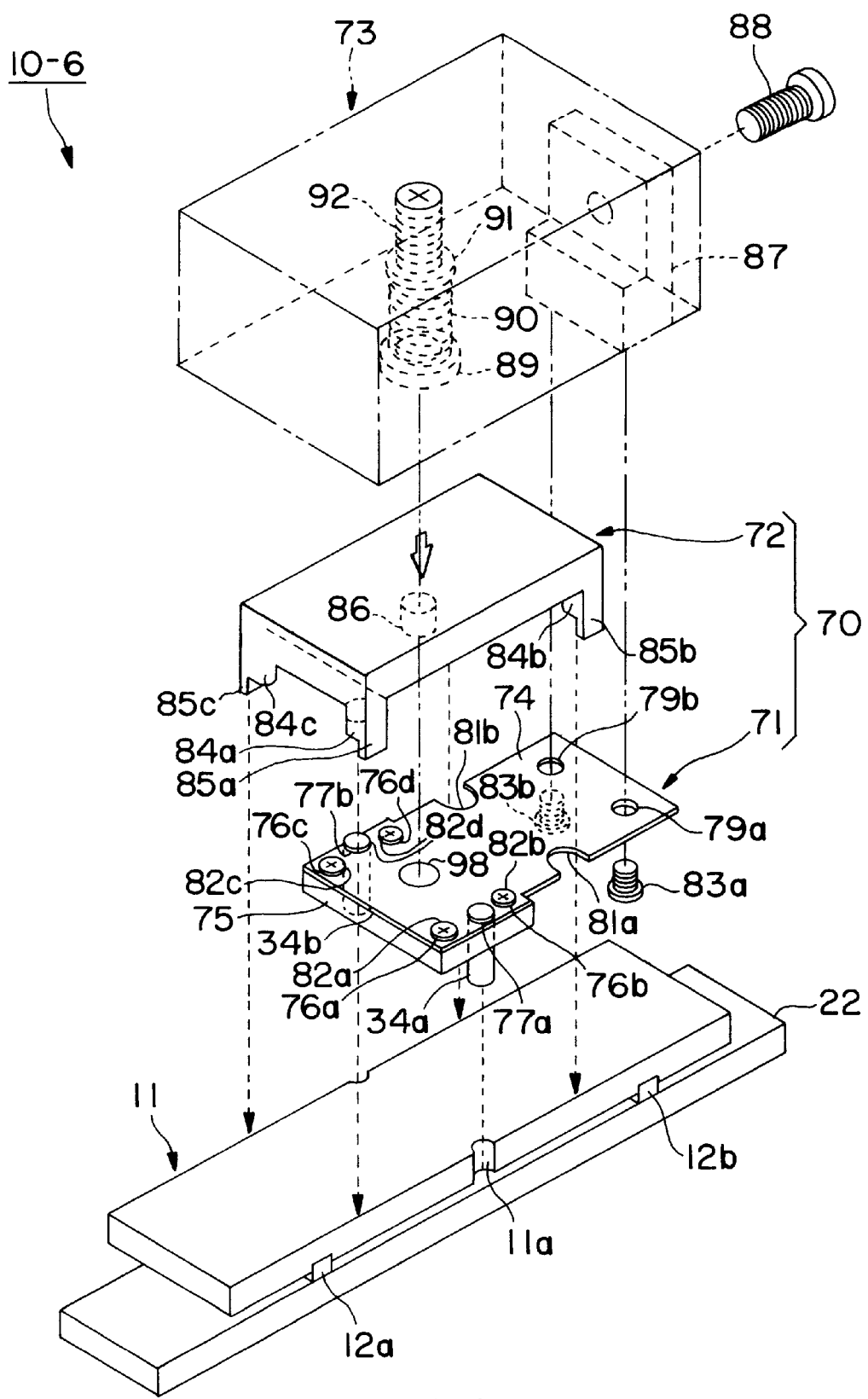
FIG. 13 is a partially transparent perspective exploded view of an ultrasonic actuator in accordance an eighth embodiment of the present invention.
Figure 14:
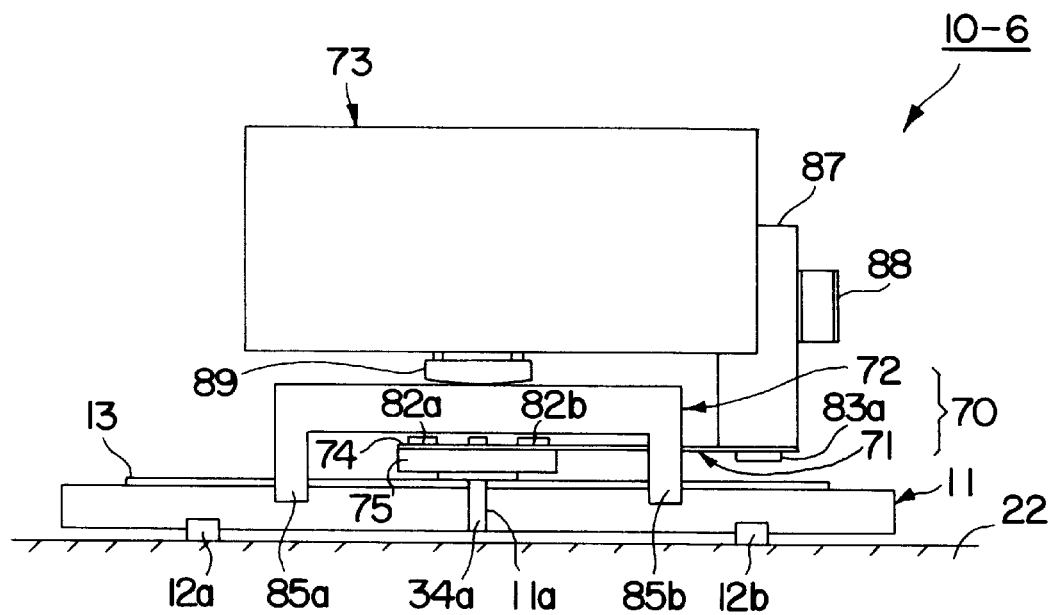
FIG. 14 is a front view of the ultrasonic actuator in accordance with the eighth embodiment of the present invention.
Figure 15:
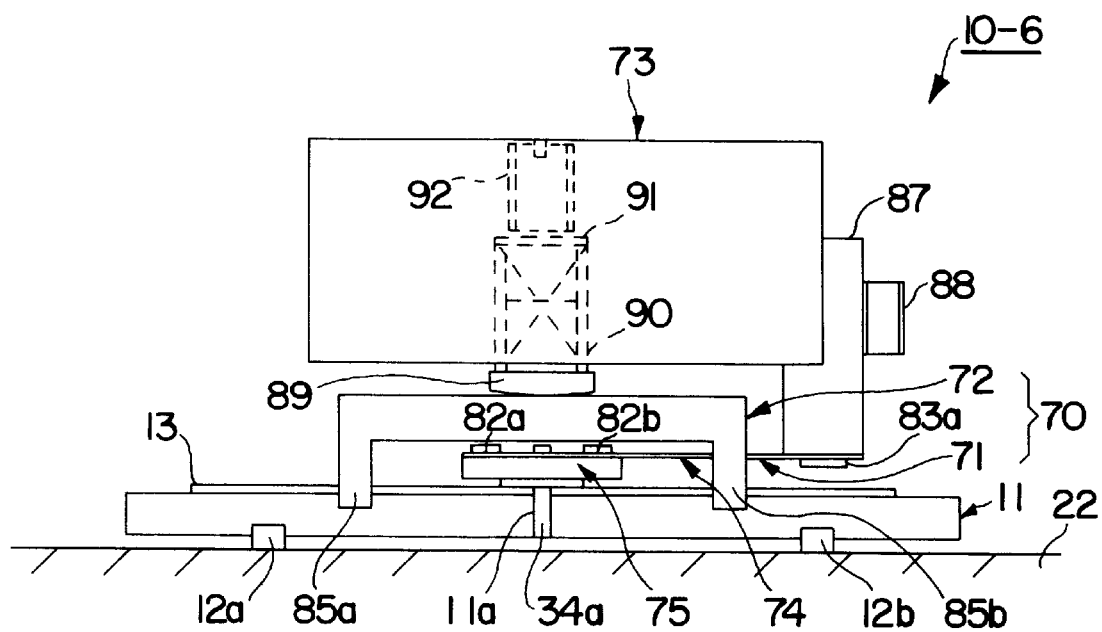
FIG. 15 is a partially transparent front view of the ultrasonic actuator in accordance with the eighth embodiment of the present invention.
Figure 16:
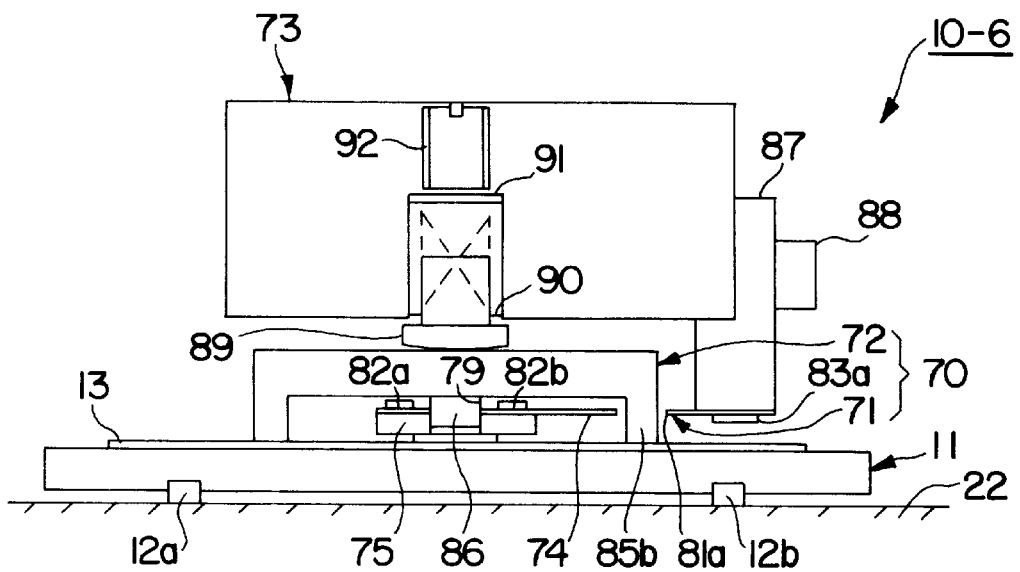
FIG. 16 is a longitudinal sectional view taken in the center of the ultrasonic actuator in accordance with the eighth embodiment of the present invention.

FIG. 13 is a perspective exploded view of an ultrasonic actuator 10-6 in accordance with an eighth preferred embodiment of the present invention. Moreover, FIG. 14 is a front view of the ultrasonic actuator 10-6 in accordance with the eighth embodiment; FIG. 15 is a partially transparent front view of the ultrasonic actuator 10-6 in accordance with the eighth embodiment; and FIG. 16 is a longitudinal sectional view in the center of the ultrasonic actuator 10-6 in accordance with the eighth embodiment. Furthermore, for convenience of description, the piezoelectric member 13 and silver electrodes 15 are omitted from FIG. 13, and the silver electrodes 15 are omitted from FIGS. 14–16.

As shown in FIGS. 13–16, the ultrasonic actuator 10-6 in accordance with the eighth embodiment of the invention includes a vibration element 11; a relative motion member 22; and a fixed member 70 comprising a support member 71 to support the vibration element 11, a compression member 72 to compress the vibration element 11 toward the relative motion member 22, and a base member to support the fixed member 70.

The seventh embodiment of the present invention differs from the previous embodiments in the support member 71, compression member 72, and base member 73. These differing portions are described in detail hereinbelow.

Figure 17:
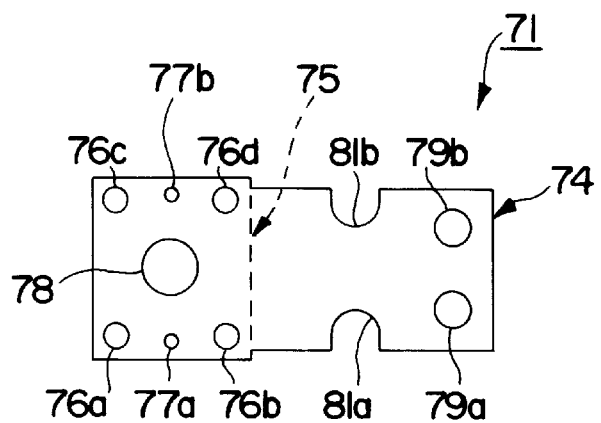
FIG. 17 is a top view of a support member in accordance with the eighth embodiment of the present invention.
Figure 18A:
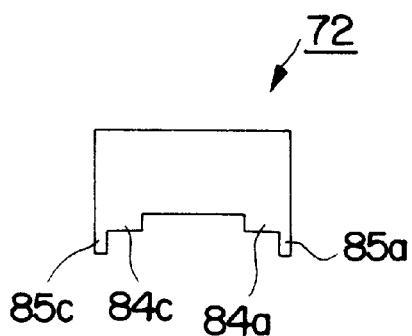
FIGS. 18A–18D are a left side view, a front view, a right side view and a lower surface view, respectively, of a compression member in accordance with the eighth embodiment of the present invention.
Figure 18B:
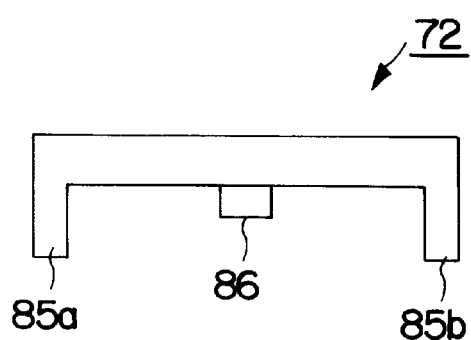
Figure 18C:
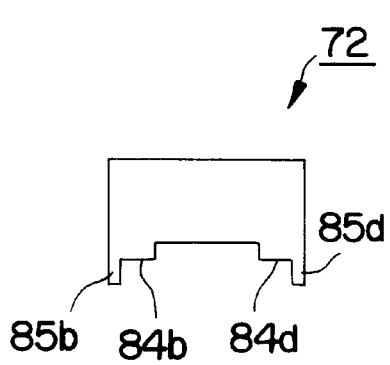
Figure 18D:
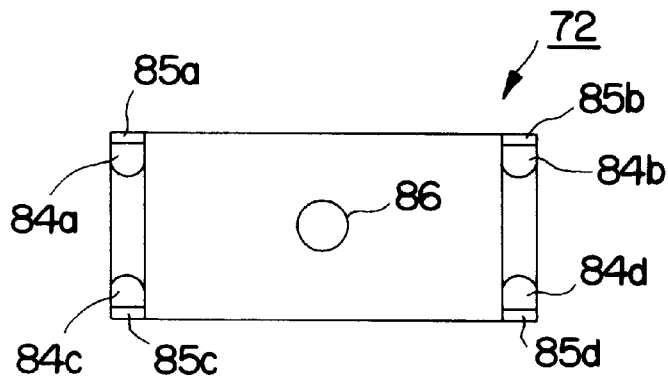

FIG. 17 is a top view of a support member 71 in accordance with the eighth preferred embodiment of the invention. As shown in FIGS. 13–17, the support member 71 includes an elastic plate 74 and a support plate 75. The elastic plate 74 comprises an elastic material, for example, a metallic material. As shown in FIG. 17, the elastic plate 74 is thin and has an approximately rectangular flat plate shape. The elastic plate 74 includes four support plate mounting holes 76a–76d, and two (2) restricting pin mounting holes 77a, 77b, a piezoelectric member movement limiting hole 78, and two mounting holes 79a, 79b to the base member. Moreover, U-shaped notch portions 81a, 81b are disposed in about the centers of the two side faces of the elastic plate 74.

On the other hand, the support plate 75 comprises, for example, a metallic material, and is a plate member having adequate rigidity. Four screw holes are disposed in the support plate 75 in positions which coincide with the support plate mounting holes 76a–76d disposed in the elastic plate 74. Moreover, a through hole is disposed in the support plate 75 having the same diameter as, and corresponding in position to, the compression member movement limiting hole 78 in the elastic plate 74. Furthermore, the support plate 75 includes through holes having the same diameter as, and corresponding in position to, the restricting pin mounting holes 77a, 77b disposed in the elastic plate 74. The support plate 75 is fixed to the elastic plate 74 by screw setting in the screw holes, inserting screws 82a–82d in the support plate mounting holes 76a–76d, so as to be superposed coincident with the holes.

Moreover, as shown in the drawings, the restricting pins 34a, 34b which are first restriction members, pass through through holes disposed in the elastic plate 74 and support plate 75, and are perpendicularly fixed, for example by welding, adhesion, or the like suitable means. The restricting pins 34a, 34b extend toward the vibration element 11. The restricting pins 34a, 34b are mounted to the support plate 71 at a pitch about coinciding with the pitch of the notches 11a, 11b disposed in the vibration element 11.

The support member 71 is fixed by mounting screws 83a, 83b which pass through the mounting holes 79a, 79b, in the bottom surface of an L-shaped block 87 which is disposed in the base member 73, described in detail hereinafter. In the above-described manner, elastic plate 74 acts as a plate spring.

Accordingly, the restricting pins 34a, 34b fixed to the support member 71, the elastic plate 74 can minutely deform about rectilinearly by bending in the direction in which the compressive force acts which compresses the vibration element 11 toward the relative motion member 22.

FIG. 18 is a four surface view of the compression member 72 in accordance with the eighth embodiment of the present invention. More particularly, FIG. 18A is a left side view, FIG. 18B is a front view, FIG. 18C is a right side view, and FIG. 18(D) is a lower surface view of the compression member 72. As shown in FIGS. 18A–18D, the compression member 72 is a rectangular parallelepipedal box made of suitable material.

Furthermore, in a manner similar to the third embodiment, in accordance with the eighth embodiment, the material of the restricting pins 34a, 34b or compression member 72 which contacts with the vibration element 11 may be formed of at least one of materials such as methacrylic resin, phenolic resin, polyamide resin, fluoro resin, polyacetal resin, ABS resin, polyimide resin, polyethylene resin, PVC, polycarbonate resin, polypropylene resin, polystyrene resin, and epoxy resin, which is desirable in order to suppress, as much as possible, the vibration attenuation of the vibration element 11.

Projecting units 84a–84d having semicylindrical form, which are second restriction members, are disposed in the four corners of the compression member 72. The projecting units 84a, 84c are positioned to contact in positions which extend over the nodal position n2 of the fourth order bending vibration B4 generated in the vibration element 11. Moreover, the projecting units 84b, 84d are positioned as to contact in positions which extend over the nodal position n4 of the fourth order bending vibration B4. In the above manner, the vibration element 11 is reliably restricted in the vibration direction of the bending vibration B4 by the projecting units 84a–84d. Furthermore, the contact positions of the projecting units 84a–84d are not necessarily as positions which exactly coincide with the nodal positions n2, n4, but may be in the neighborhood of the nodal positions n2, n4.

Claw members 85a–85d are disposed projecting toward the vibration element 11 and outside the projecting units 84a–84d. The inner faces of the claw members 85a–85d are in contact with the side faces of the vibration element 11. The claw members 85a–85d restrict the vibration element 11 in its amplitude direction.

In the above manner, in accordance with the eighth embodiment of the invention, the vibration element 11 is restricted in the vibration direction of the bending vibration B4 by the projecting units 84a–84d which are disposed in the compression member 72. Furthermore, the vibration element 11 is restricted in two directions, specifically, the vibration direction of the bending vibration B4 and the direction at right angles to the vibration direction of the longitudinal vibration L1 and the vibration direction of the bending vibration B4, by the claw members 85a–85d disposed in the compression member 72.

A semicylindrical projecting unit 86 is disposed in about the center of the compression member 72, facing the support member 71. The projecting unit 86 has an external diameter smaller than the compression member movement limiting hole 78 in the support member 71, and is inserted with clearance into the compression member movement limiting hole 78. In accordance with the eighth embodiment of the invention, a movement limiting mechanism is formed by the projecting unit 86 disposed in the compression member 72, and the compression member movement limiting hole 78 disposed in the support member 71. The movement of the compression member 72 is limited in the vibration direction of the longitudinal vibration L1 by the movement limiting mechanism.

As shown in FIGS. 14 and 15, in accordance with the eighth embodiment of the invention, the restricting pins 34a, 34b are joined by suitable means, for example, welding or adhesion, and the like. In this manner, with the support member 71 in a state joined to the vibration element 11, the compression member 72 is caused to contact the vibration element 11 at a predetermined position. Thereupon, as shown in FIG. 16, the projecting unit 86 passes through the compression member movement limiting hole 79 in a state having clearance. Accordingly, the movement of the compression member 72 in the vibration direction of the longitudinal vibration is limited by the support member 71.

During the movement of the compression member 72, the projecting unit 84b and the claw member 85b pass through the U-shaped notch unit 81a. Moreover, the projecting unit 84d and the claw member 85d pass through the U-shaped notch unit 81b. Because a clearance exists between the projecting unit 86 and the compression member movement limiting hole 78, the compression member 72 displaces minutely in the vibration direction of the longitudinal vibration. However, because of this displacement, the projecting unit 84*b* and the claw member 85*b* both do not make contact with the notch unit 81*a*. Moreover, the projecting unit 84*d* and the claw member 85*d* both do not make contact with the U-shaped notch unit 81*b*. In the above manner, the support member 71 and the compression member 72, as shown in FIGS. 14–16, do not mutually interfere, and both the support member 71 and the compression member 72 are arranged in a displacement state with respect to the direction of the compressive force acting to compress the vibration element 11 toward the relative motion member 22.

In accordance with the eighth embodiment of the invention, the vibration element 11 is supported without play by means of the support member 71 via the restricting pins 34*a*, 34*b*, and moreover the vibration element is urged toward the relative motion member 22 by the compression member 72.

The base member 73 is a housing member having a rectangular shape. An L-shaped bracket 87 is fixed by a bolt 88 to the outer surface of the base member 73. As described above, the support member 71 is fixed to the bottom surface of the L-shaped bracket 86.

Moreover, an about cylindrical terminal 89 for compression use is housed in the interior of the base member 73. The cylindrical terminal 89 has a large diameter at one end, and with the large diameter end exposed to the exterior. A coil spring 90, which is a first compressive force generating member, is mounted on the periphery of the small diameter portion of the cylindrical terminal 89. A compressive force adjustment screw 92 is screw set into the base member 73 via a cylindrical spring length adjustment member 91 in the rear end of the coil spring 90.

The ultrasonic actuator 10-6 in accordance with the eighth embodiment of the invention is assembled as shown in FIGS. 14–16, the relative motion member 22, vibration element 11, support member 71, compression member 72 and base member 73 being placed as shown in FIG. 13. During assembly, the end of the cylindrical terminal 89 is placed in contact in about the center of the upper surface of the compression member 72. By adjusting the screwed-in position of the compression adjustment screw 92, the spring force generated by the coil spring 90 is adjusted, and the compressive force which is transmitted to the compression member 72 via the compression terminal 89 is adjusted.

In accordance with the eighth embodiment of the invention, the support of the vibration element 11 by the support member 71, and the compression of the vibration element 11 by the compression member 72, can be performed by the fixed member 70 without mutual interference between the support member 71 and the compression member 72.

Moreover, in accordance with the eighth embodiment of the invention, because it is not necessary to perform compression of the vibration element 11 by the support member 71, the support member 71 and the vibration element 11 can be brought into contact by the fixed member 70. In this manner, the vibration element 11 can be compressed by the fixed member 70 with a desired compressive force and without play toward the relative motion member 22.

Ninth Preferred Embodiment

In accordance with the ninth preferred embodiment of the present invention, the respective forms of the support member 71 and compression member 72 described with respect to the eighth embodiment are altered.

Figure 19:
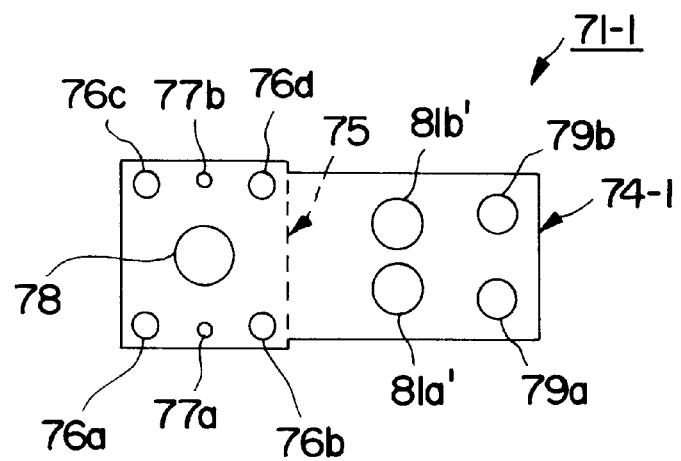
FIG. 19 is a top view of a support member in accordance with a ninth embodiment of the present invention.

FIG. 19 is a top view of the support member 71-1 in accordance with the ninth embodiment of the invention. Moreover, FIGS. 20A–20D are four surface views of the compression member 72-1 in accordance with the ninth embodiment. Specifically, FIG. 20A is a left side view, FIG. 20B is a front view, FIG. 20C is a right side view, and FIG. 20D is a lower surface view of the support member 72-1 in accordance with the ninth embodiment. Moreover, in the description of FIGS. 19 and 20, portions which are the same as those in the eighth embodiment shown in FIGS. 17 and 18 are referred to by the same reference symbols, and detailed descriptions of the like elements will not be repeated here.

The elastic plate 74-1 which comprises the support member 71-1 in the ninth embodiment includes through holes 81*a*', 81*b*' instead of the U-shaped notches 81*a*, 81*b* in the eighth embodiment. As shown in FIG. 19, the through holes 81*a*', 81*b*' are formed in positions a little inside of the edges of the elastic plate 74-1.

Moreover, the support member 71-1 in accordance with the ninth embodiment include projecting units 84*a*–84*d* at positions a little more inside than those in the eighth embodiment. The pitch of the projecting units 84*a* and 84*c*, and the pitch of the projecting units 84*b* and 84*d*, together, is the same as the pitch of the through holes 81*a*' and 81*b*'. In the accordance with the ninth embodiment of the invention, the projecting unit 84*b* passes through the through hole 81*a*' with clearance, and the projecting unit 84*d* passes through the through hole 81*b*' with clearance.

Furthermore, the support member 72-1 in accordance with the ninth embodiment does not include claw members 85*b*, 85*d*, and the restriction of the vibration element 11 in the width direction is performed by the claw members 85*a*, 85*c*.

In accordance with the ninth embodiment of the invention, about similar effects can be obtained to those of the eighth embodiment with a structure simpler than that of the eighth embodiment.

FIG. 21 is a partially transparent front view of an ultrasonic actuator 10-7 in accordance with the tenth preferred embodiment of the present invention. The ultrasonic actuator 10-7 in accordance with the tenth embodiment differs from the ultrasonic actuator 10-6 of the eighth embodiment shown in FIGS. 13–16 in that the position of contact on the upper surface of the vibration element 11 by the projecting units 84*a*–84*d* disposed in the compression member 72 is changed.

As shown in FIG. 21, in accordance with the tenth embodiment, the projecting units 84*a*–84*d* are similar to the ultrasonic actuator 10-3 of the fifth embodiment shown in FIGS. 9 and 10, or to the ultrasonic actuator 10-4 of the sixth embodiment shown in FIG. 11. Contact with the upper surface of the vibration element 11 at the vibration element end is more than the drive force output members 12*a*, 12*b* with respect to the direction of relative motion.

The position at which the projecting units 85*a*, 85*c* contact the vibration element 11 is corresponds to an outer nodal position n1 of the bending vibration B4. The position at which the projecting units 85*b*, 85*d* contact the vibration element 11 corresponds to an outer nodal position n5 of the bending vibration B4.

Moreover, similarly to the ultrasonic actuator 10-6 of the eighth embodiment, the drive force output members 12*a*, 12*b* are disposed in antinode positions l1, l4 of the bending vibration B4.

Accordingly, the pitching motion in which the length direction end portions of the vibration element 11 are caused to rise and fall in mutually opposite directions can be reliably suppressed or eliminated. Moreover, in accordance with the tenth embodiment, the noise generation due to the pitching vibration can be reduced. Moreover, the clutch function which is the role of the bending vibration B4 can operate effectively, and by this means, the drive force of the vibration element 11 can be efficiently transmitted to the relative motion member 22. Accordingly, the ultrasonic actuator 10-7 in accordance with the tenth embodiment increases the drive force and driving efficiency over those of the ultrasonic actuator 10-6 of the eighth embodiment.

In the descriptions of each embodiment, an ultrasonic motor has been taken as an example of a vibration actuator. However, there is no such limitation of the vibration actuator of the present invention, and it can equally well be applied to vibration actuators which use vibration regions other than the ultrasonic.

Moreover, in accordance with embodiments of the present invention, examples have been described with respect to vibration elements using degenerate modes of different form, which cause the generation of a first vibration which is a first order longitudinal vibration, and a second vibration which is a fourth order bending vibration. However, the present invention is not limited to a vibration actuator using such modes, and vibration actuators which generate other vibrations are equally suitable for application. For example, the present invention is equally applicable to a vibration actuator including a vibration element having degenerate modes of different form, causing the generation of a first vibration which is a first order longitudinal vibration, and a second vibration which is a second order, sixth order, or eighth order bending vibration.

Moreover, the present invention is also applicable to a vibration actuator having a vibration element using the combination of other than a longitudinal vibration and a bending vibration, to generate a first vibration which vibrates in the direction of relative motion, and a second vibration which vibrates in a direction intersecting the direction of relative motion, and having an output vibration element which outputs drive force from plural drive force output members in the direction of relative motion. For example, the present invention may be applied to a vibration actuator including a vibration element having both an electromechanical conversion element which generates vibration in the length direction, and an electromechanical conversion element which generates deformation in the elastic member thickness direction, mounted in a laminated configuration in the elastic member end side.

More particularly, the present invention generates a first vibration which vibrates in the direction of relative motion, and a second vibration which vibrates in a direction which intersects the direction of relative motion and, by application to a vibration actuator having a vibration element which generates an elliptical motion in plural drive force output members which are located in the direction of relative motion, suppresses or eliminates the pitching vibration during driving of the vibration actuator, suppresses a decrease of driving efficiency, and suppresses the respective vibration attenuation of the first and second vibrations which accompany compression, can cause balance at a high level, and is desirable.

Moreover, the present invention is also applicable to a vibration actuator having a first restriction member which restricts with respect to the direction of vibration of the first vibration, and a second restriction member which restricts the vibration element as regards the vibration direction of the second vibration in at least two places relating to the vibration direction of the first vibration, the first restriction member and second restriction member do not influence the respective location state. For example, the first restriction member is not disposed in a compression support member, and can for example be mounted directly in the roof surface of the casing, or, intermediately via a screw.

Moreover, in accordance with embodiments of the present invention, the second restriction member, is disposed in two places relating to the vibration direction of the second vibration. However, the present invention is not limited to this type of vibration actuator, and the second restriction member may be disposed in three or more places. For example, as shown in FIG. 1A, the second restriction members are disposed in three places, the nodal positions n2, n3 and n4.

Moreover, in accordance with embodiments of the present invention, the first restriction members are fitted with play in notch units disposed in center positions of both side surfaces of the length direction of the vibration element. However, the present invention is not limited to this type of first restriction member. For example, the first restriction members may be fitted coupled to the vibration element at positions other than these positions.

Moreover, in accordance with embodiments of the present invention, the first restriction members are fitted into semi-circular notches disposed in the vibration element. However, the first restriction member may be disposed in the vibration element and fitted in a manner having a clearance.

Moreover, in the accordance with the first through seventh embodiments of the invention, the projecting unit, which is a second restriction member, supports using a compression support member. However, the vibration actuator is not limited to this type of projecting unit. For example, in a manner similar to the eighth through tenth embodiments, the restricting pins and projecting units may be supported without using a compression support member.

Moreover, in accordance with embodiments of the present invention, the first restriction member and the compression support member are coupled in three states: (1) to fit in having clearance in the compression support member, (2) to fit in having no clearance in the compression support member, (3) fixed in the flat surface of the vibration element side of the compression support member. However, the coupling in the vibration actuator is not limited to these three states, and fitting of the first restriction member into the compression support member in other configurations is likewise applicable.

Moreover, in accordance with the fifth through seventh embodiments, an example was given of a projecting unit which compresses the vibration element in the whole length of the width direction of the vibration element. However, the vibration actuator is not limited to compressing the vibration element in this manner, and compression in a portion of the width direction of the vibration element is equally applicable to the present invention.

Moreover, in accordance with the eighth embodiment of the present invention, the vibration element 11 is compressed using a coil spring 90 which is a first compressive force generating member. However, the present invention is not limited to compressing the vibration element in this manner, and the eighth embodiment may include a second compression generation member together with the coil spring 90, as described with respect to the fourth embodiment shown in FIGS. 6–8.

Moreover, in accordance with the eighth embodiment of the invention, the vibration element 11 was restricted using restricting pins 34a, 34b, which are the first restriction members, and projecting units 84a–84d which are the second restriction members. However, the present invention is not limited to restricting the vibration element in this manner. For example, the eighth embodiment of the invention may include with restricting pins 34a, 34b, and projecting units 84a–84d, together with third restriction members, as described with respect to the fourth embodiment shown in FIGS. 6–8.

Moreover, in accordance with the eighth embodiment of the invention, the movement limiting mechanism limits the movement of the compression member 72 in the vibration direction of the longitudinal vibration by disposing the projecting unit 86 in the compression member 72 and disposing the compression member movement limiting hole 78 in the support member 71. However, the present invention is not limited to such a configuration. For example, a suitable movement limiting mechanism may be disposed in one of the support member 71 and compression member 72.

Furthermore, in accordance with embodiments of the present invention, the electro-mechanical conversion element is a piezoelectric element. However, the present invention is not limited to a vibration actuator using a piezoelectric element, and any element which converts electrical energy into mechanical element can equally well be applied. For example, an electrostrictive element can be used instead of a piezoelectric element.

In accordance with embodiments of the present invention, the occurrence of a pitching vibration can be markedly suppressed, or eliminated.

In accordance with embodiments of the present invention, the drive force generated by the vibration element is not attenuated, as much as possible.

In accordance with embodiments of the present invention, there is no play between the first restriction member and the vibration element.

In accordance with embodiments of the present invention, by displaceably locating both the first and second restriction members without mutual effects with respect to the direction of action of the compressive force between the vibration element and the relative motion member, the occurrence of a pitching vibration can be markedly suppressed, or eliminated.

In accordance with embodiments of the present invention, the compression member limits movement in the vibration direction of the first vibration.

In accordance with embodiments of the present invention, the second restriction member restricts the vibration element in two directions, the vibration direction of the second vibration and a direction which intersects the vibration direction of the first vibration and the direction of vibration of the second vibration.

In accordance with embodiments of the present invention, the vibration element is supported freely displaceably in the compression direction.

In accordance with embodiments of the present invention, a compression support mechanism having a simplified design and smaller size can be achieved.

In accordance with embodiments of the present invention, by urging the vibration element in the direction of the relative motion member, the occurrence of a pitching vibration can be markedly suppressed, or eliminated.

In accordance with embodiments of the present invention, the vibration generated by the vibration element is not attenuated to as great an extent as possible.

In accordance with embodiments of the present invention, fine adjustment of the compressive force of the first compressive force generating member and the second compressive force generating member can be easily and accurately performed.

In accordance with embodiments of the present invention, the generation of pitching vibrations is markedly suppressed.

In accordance with embodiments of the present invention, a maximum driving efficiency can be achieved.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A vibration actuator, comprising:

a vibration element including an electro-mechanical conversion element and a drive force output portion to output a drive force obtained by the excitation of the electro-mechanical conversion element and to cause relative motion between the vibration element and a relative motion member contacting the drive force output portion;

a base member; and a fixed member to fix the vibration element to the base member, wherein the vibration element generates, by the excitation of the electro-mechanical conversion element, a first vibration in a first direction, and a second vibration in a second direction different from the first direction, and the fixed member includes a first restriction member to restrict the vibration element in a vibration direction of the first vibration, a second restriction member located in at least two places along the vibration direction of the first vibration to restrict the vibration element in a vibration direction of the second vibration, a compression member and a support member, and the compression member compresses the vibration element toward the relative motion member, the support member displaceably supports the vibration element in a direction in which a compressive force acts on the relative motion member, the compression member and the support member are both displaceable in the direction in which the compressive force acts without mutual interference, the first restriction member is located in the support member, and the second restriction member is located in the compression member.

2. A vibration actuator as recited in claim 1, wherein at least one of the compression member and the support member includes a movement limiting mechanism to limit the movement of the compression member in the direction vibration of the first vibration.

3. A vibration actuator as recited in claim 1, wherein a contact portion of the second restriction member with the vibration element restricts the vibration in a vibration direction of the second vibration and in a direction intersecting the vibration direction of the first vibration and the vibration direction of the second vibration.

4. A vibration actuator as recited in claim 1, wherein the first restriction member couples to the vibration element in a position of, or a neighborhood of, a node of the first vibration, and the second restriction member couples to the vibration element in a position of, or a neighborhood of, a node of the second vibration.

5. A vibration actuator as recited in claim 1, wherein the first restriction member is relatively movable with respect to the vibration element in the direction of vibration of the second vibration, and the second restriction member is relatively movable with respect to the vibration element in the vibration direction of the first vibration.

6. A vibration actuator as recited in claim 1, wherein
at least a contact portion of the second restriction member with the vibration element comprises at least one material selected from methacrylic resin, phenolic resin, polyamide resin, fluoro resin, polyacetal resin, acrylonitrile-butadiene-styrene resin, polyimide resin, polyethylene resin, PVC, polycarbonate resin, polypropylene resin, polystyrene resin, and epoxy resin.

7. A vibration actuator as recited in claim 4, wherein
the drive force output portion is located along the first vibration direction of the vibration element, and
the second restriction member couples to the vibration element at a position with respect to the first vibration direction closer to an end side of the vibration element than the drive force output portion.

8. A vibration actuator as recited in claim 7, wherein
the drive force output portion is located at an antinode position or in a neighborhood of the antinode position of the second vibration, with respect to the first vibration direction.

9. A vibration actuator as recited in claim 7, wherein
the coupling position is at a node position or in the neighborhood of the node position of the second vibration.

10. A vibration actuator, comprising:
a vibration element including an electro-mechanical conversion element and a drive force output portion to output a drive force obtained by the excitation of the eletro-mechanical conversion element and to cause relative motion between the vibration element and a relative motion member contacting the drive force output portion;
a base member; and
a fixed member to fix the vibration element to the base member, wherein the vibration element generates, by the excitation of the electro-mechanical conversion element, a first vibration in a first direction, and a second vibration in a second direction different from the first direction, and
the fixed member includes a first restriction member to restrict the vibration element in a vibration direction of the first vibration, a second restriction member located in at least two places along the vibration direction of the first vibration to restrict the vibration element in a vibration direction of the second vibration, and a compression support member which is displaceably supported in a direction of a force acting to compress the vibration element toward the relative motion member, and
the first restriction member and the second restriction member are located in the compression support member.

11. A vibration actuator as recited in claim 10, wherein
the first restriction member couples to the vibration element in a position of, or a neighborhood of, a node of the first vibration, and
the second restriction member couples to the vibration element in a position of, or a neighborhood of, a node of the second vibration.

12. A vibration actuator as recited in claim 10, wherein
at least a contact portion of the second restriction member with the vibration element comprises at least one material selected from methacrylic resin, phenolic resin, polyamide resin, fluoro resin, polyacetal resin, acrylonitrile-butadiene-styrene resin, polyimide resin, polyethylene resin, PVC, polycarbonate resin, polypropylene resin, polystyrene resin, and epoxy resin.

13. A vibration actuator as recited in claim 11, wherein
the drive force output portion is located along the first vibration direction of the vibration element, and
the second restriction member couples to the vibration element at a position with respect to the first vibration direction closer to an end side of the vibration element than the drive force output portion.

14. A vibration actuator as recited in claim 13, wherein
the drive force output portion is located at an antinode position or in a neighborhood of the antinode position of the second vibration, with respect to the first vibration direction.

15. A vibration actuator as recited in claim 13, wherein
the coupling position is at a node position or in the neighborhood of the node position of the second vibration.

16. A vibration actuator, comprising:
a vibration element including an electro-mechanical conversion element and a drive force output portion to output a drive force obtained by the excitation of the electro-mechanical conversion element and to cause relative motion between the vibration element and a relative motion member contacting the drive force output portion;
a base member; and
a fixed member to fix the vibration element to the base member,
wherein the vibration element generates, by the excitation of the electro-mechanical conversion element, a first vibration in a first direction, and a second vibration in a second direction different from the first direction, and
the fixed member includes a first restriction member to restrict the vibration element in a vibration direction of the first vibration, a second restriction member located in at least two places along the vibration direction of the first vibration to restrict the vibration element in a vibration direction of the second vibration, and a first compression force generating member to press the second restriction member to the vibration element to produce contact between the vibration element and the relative motion member with a predetermined compressive force.

17. A vibration actuator as recited in claim 16, wherein
the first restriction member couples to the vibration element in a position of, or a neighborhood of, a node of the first vibration, and
the second restriction member couples to the vibration element in a position of, or a neighborhood of, a node of the second vibration.

18. A vibration actuator as recited in claim 16, wherein
at least a contact portion of the second restriction member with the vibration element comprises at least one material selected from methacrylic resin, phenolic resin, polyamide resin, fluoro resin, polyacetal resin, acrylonitrile-butadiene-styrene resin, polyimide resin, polyethylene resin, PVC, polycarbonate resin, polypropylene resin, polystyrene resin, and epoxy resin.

19. A vibration actuator as recited in claim 16, further comprising:
a second compression force generating member, located with respect to the vibration element on a side opposite to the side where the first compression force generating member is located, to press the vibration element on the second restriction member.

20. A vibration actuator as recited in claim 17, wherein
the drive force output portion is located along the first vibration direction of the vibration element, and the second restriction member couples to the vibration element at a position with respect to the first vibration direction closer to an end side of the vibration element than the drive force output portion.

21. A vibration actuator as recited in claim 20, wherein the drive force output portion is located at an antinode position or in a neighborhood of the antinode position of the second vibration, with respect to the first vibration direction.

22. A vibration actuator as recited in claim 20, wherein the coupling position is at a node position or in the neighborhood of the node position of the second vibration.

* * * * *

UNITED STATES PATENT AND TRADEMARK OFFICE
CERTIFICATE OF CORRECTION

PATENT NO. : 6,242,846 B1
DATED : June 5, 2001
INVENTOR(S) : Takatoshi Ashizawa et al.

It is certified that error appears in the above-identified patent and that said Letters Patent is hereby corrected as shown below:

<u>Column 33,</u>
Line 34, after "member" beginning with "wherein" should begin a new paragraph.

Signed and Sealed this

Second Day of July, 2002

*Attest:*

*Attesting Officer*

JAMES E. ROGAN
*Director of the United States Patent and Trademark Office*